(12) United States Patent
Ueda

(10) Patent No.: US 10,396,153 B2
(45) Date of Patent: Aug. 27, 2019

(54) SEMICONDUCTOR DEVICE AND METHOD OF MANUFACTURING SEMICONDUCTOR DEVICE

(71) Applicant: Renesas Electronics Corporation, Tokyo (JP)

(72) Inventor: Takehiro Ueda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/889,244

(22) Filed: Feb. 6, 2018

(65) Prior Publication Data
US 2018/0286948 A1    Oct. 4, 2018

(30) Foreign Application Priority Data

Mar. 31, 2017    (JP) .................................. 2017-070444

(51) Int. Cl.
| | | |
|---|---|---|
| H01L 29/15 | (2006.01) | |
| H01L 29/06 | (2006.01) | |
| H01L 29/205 | (2006.01) | |
| H01L 21/265 | (2006.01) | |
| H01L 29/778 | (2006.01) | |
| H01L 29/66 | (2006.01) | |
| H01L 21/761 | (2006.01) | |
| H01L 29/40 | (2006.01) | |

(Continued)

(52) U.S. Cl.
CPC .... H01L 29/0688 (2013.01); H01L 21/26546 (2013.01); H01L 21/761 (2013.01); H01L 29/0646 (2013.01); H01L 29/0657 (2013.01); H01L 29/205 (2013.01); H01L 29/402 (2013.01); H01L 29/42368 (2013.01); H01L 29/66462 (2013.01); H01L 29/7786 (2013.01); H01L 29/7787 (2013.01); H01L 29/2003 (2013.01)

(58) Field of Classification Search
CPC .................................................. H01L 29/0688
USPC ........................................................ 257/76
See application file for complete search history.

(56) References Cited

U.S. PATENT DOCUMENTS

| | | | |
|---|---|---|---|
| 8,716,755 B2 | 5/2014 | Inoue et al. | |
| 2010/0117118 A1* | 5/2010 | Dabiran | H01L 29/207 257/190 |

(Continued)

FOREIGN PATENT DOCUMENTS

| | | | |
|---|---|---|---|
| JP | 2013-065649 A | 4/2013 | |
| JP | 2013065649 A | * 4/2013 | ........... H01L 29/205 |

*Primary Examiner* — Ajay Arora
(74) *Attorney, Agent, or Firm* — Mattingly & Malur, PC

(57) ABSTRACT

A high-electron-mobility transistor has a buffer layer, a channel layer, a barrier layer, a mesa-shaped cap layer, a source electrode formed on one side of the cap layer, a drain electrode formed on the other side, and a gate electrode formed over the cap layer via a gate insulating film. The semiconductor device has an element isolation region defining an active region in which the semiconductor device is provided. The gate electrode extends from over the active region to the over the element isolation region. In plan view, the active region has a projection part projected to the direction of the element isolation region in a region overlapped with the gate electrode. By providing the active region with a projection part, the channel length of a parasitic transistor can be increased, and turn-on of the parasitic transistor can be suppressed.

19 Claims, 37 Drawing Sheets

(51) Int. Cl.
*H01L 29/423* (2006.01)
*H01L 29/20* (2006.01)

(56) References Cited

U.S. PATENT DOCUMENTS

2013/0069071 A1* 3/2013 Inoue .................... H01L 29/205
257/76
2018/0097070 A1* 4/2018 Miura ................. H01L 29/2003

* cited by examiner

SEMICONDUCTOR DEVICE AND METHOD OF MANUFACTURING SEMICONDUCTOR DEVICE

CROSS-REFERENCE TO RELATED APPLICATIONS

The disclosure of Japanese Patent Application No. 2017-070444 filed on Mar. 31, 2017 including the specification, drawings and abstract is incorporated herein by reference in its entirety.

BACKGROUND

The present invention relates to a semiconductor device and a method of manufacturing a semiconductor device and can be suitably used for, for example, a semiconductor device using nitride semiconductor.

GaN nitride semiconductor has high electron mobility and a wider band gap as compared with Si and GaAs, so that it is expected to be applied to a transistor for use of higher withstand voltage, higher output, and higher frequency. In recent years, the GaN nitride semiconductor is actively developed. Among such transistors, a transistor having a normally off characteristic is useful, and a structure for providing the normally off characteristic is examined.

For example, Japanese Unexamined Patent Application Publication No. 2013-065649) discloses a transistor using a nitride semiconductor layer as a channel. In the transistor, 2DEG (two-dimensional electron gas) is generated at an interface between a barrier layer and a channel layer. Below the gate electrode, a cap layer is provided, and generation of 2DEG is suppressed.

SUMMARY

The inventors of the present invention are engaged in research and development of a semiconductor device using nitride semiconductor and are keenly examining improvement of the characteristics of a semiconductor device. Particularly, the inventors examine the structure (mesa-shaped MOS structure) of a transistor for providing the normally off characteristic.

As will be described later, however, humps occur in the Id-Vg waveform of a transistor and decrease in the threshold was recognized.

Particularly, in a semiconductor device using nitride semiconductor, it is being examined to increase the threshold to provide a stable normally-off characteristic, and reduction of the humps in the Id-Vg waveform is demanded.

The other problems and novel features will become apparent from the description of the specification and appended drawings.

Outline of representative one of embodiments disclosed in the present application will be briefly described as follows.

A semiconductor device of an embodiment disclosed in the present application has a buffer layer made by a first nitride semiconductor layer, a channel layer made by a second nitride semiconductor layer, and a barrier layer made by a third nitride semiconductor layer formed on the second nitride semiconductor layer which are sequentially stacked, and a cap layer (2DEG suppression layer) made by a mesa-shaped fourth nitride semiconductor layer formed on the third nitride semiconductor layer. The semiconductor device also has a source electrode formed on one of side of the cap layer, a drain electrode formed on the other side, and a gate electrode formed over the cap layer. Further, the semiconductor device has an element isolation region provided in a stack body of the first to fourth nitride semiconductor layers and defining an active region. The gate electrode extends from over the active region to over the element isolation region. In plan view, length of a border line between the active region and the element isolation region in a region overlapped with the mesa-shaped fourth nitride semiconductor layer is larger than gate length of the gate electrode.

A method of manufacturing the semiconductor device described in the embodiment disclosed in the present application has a step of sequentially forming first to fourth nitride semiconductor layers, a step of forming an element isolation region defining an active region, in a stack body of the first to fourth nitride semiconductor layers, and a step of forming a gate electrode over the mesa-shaped fourth nitride semiconductor layer. The gate electrode extends from over the active region to over the element isolation region. In plan view, length of a border line between the active region and the element isolation region in a region overlapped with the mesa-shaped fourth nitride semiconductor layer is larger than gate length of the gate electrode.

According to the semiconductor device described in the following representative embodiments, disclosed in the present application, the characteristics of the semiconductor device can be improved.

According to the method of manufacturing the semiconductor device described in the following representative embodiments, disclosed in the present application, a semiconductor device having excellent characteristics can be manufactured.

DETAILED DESCRIPTION

Figure 1:
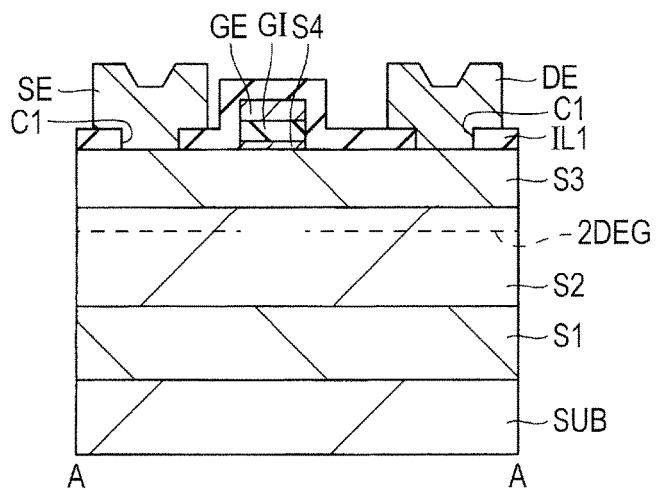
FIG. 1 is a cross section illustrating a structure of a semiconductor device of a first embodiment.

In the following embodiments, when it is necessary for convenience, an embodiment will be described by being divided into a plurality of sections or embodiments. Unless otherwise clearly specified, they are not non-related to one another but have relations such as modification, application, detailed description, and supplementary explanation in which one is a part or all of the other. In the following embodiments, in the case of referring to the number of elements and the like (including the number of pieces, numerical value, quantity, and range), except for the case where it is clearly mentioned, the case where the invention is principally clearly limited to a specific value, and the like, the invention is not limited to the specific value. The number may be larger or smaller than the specific value.

Further, in the following embodiments, obviously, components (including operation steps) are not always necessary except for the case where it is clearly mentioned, the case where it is considered that a component is principally clearly necessary, and the like. Similarly, in the following embodiments, when shape, position relation, and the like of components are mentioned, they substantially include shape and the like close or similar to them except for the case where it is clearly mentioned, the case where it is considered that the shape and the like are not principally clearly similar. This is similarly applied also to the number and the like (including the number of pieces, numerical value, quantity, and range).

Hereinafter, embodiments will be described in detail with reference to the drawings. In all of the drawings for explaining the embodiments, the same or related reference numerals are designated to members having the same function and repetitive description will not be given. When a plurality of similar members (parts) exist, in some cases, a sign is added to a generic reference numeral to indicate an individual or specific part. In the following embodiments, unless otherwise necessary, description of the same or similar parts will not be repeated as a rule.

In the drawings used in the embodiments, in some cases, hatching is omitted even in a cross section so that the drawing is easily seen. There are also cases that hatching is added even in a plan view so that the drawing is easily seen.

In the cross sections and plan views, the sizes of parts do not correspond to those of actual devices. For easier understanding of the drawings, in some cases, a specific part is displayed relatively large. Also in the case where a cross section and a plan view correspond to each other, for easier understand of the drawings, in some cases, a specific part is displayed relatively large.

First Embodiment

Hereinafter, a semiconductor device of a first embodiment will be described in detail with reference to the drawings.
Description of Structure FIG. 1 is a cross section illustrating a structure of a semiconductor device of the embodiment. The semiconductor device illustrated in FIG. 1 is a field effect transistor (FET) using nitride semiconductor. It is also called a high electron mobility transistor (HEMT).

In the semiconductor device of the embodiment, over a substrate SUB, a first nitride semiconductor layer S1, a second nitride semiconductor layer S2, and a third nitride semiconductor layer S3 are sequentially formed. On a central part in the third nitride semiconductor layer S3, a fourth nitride semiconductor layer S4 is formed. It is also possible to sequentially form a nucleation layer and a high-resistive buffer layer over the substrate SUB and, after that, form the first nitride semiconductor layer S1 or the like.

As the substrate SUB, for example, a semiconductor substrate made of silicon (Si) and whose (111) plane is exposed can be used. As the substrate SUB, a substrate made of the silicon, SiC, sapphire, or the like may be used. A substrate made of GaN may be also used. In this case, a nucleation layer may be omitted.

The nucleation layer is made by a nitride semiconductor layer. For example, an aluminum nitride (AlN) layer can be used as the nucleation layer. The high-resistive buffer layer is made by one or plural nitride semiconductor layers obtained by adding impurity forming a deep level to nitride semiconductor. For example, as a superlattice structure (also called a superlattice layer) made by a plurality of nitride semiconductor layers, a stack-layer film (AlN/GaN film) made by repeatedly stacking a gallium nitride (GaN) layer and an aluminum nitride (AlN) layer can be used as a high-resistive buffer layer.

Usually, all of a nitride semiconductor layer (group III-V compound semiconductor layer) over the substrate SUB is formed by group-III element plane growth.

As described above, over the substrate SUB, the first nitride semiconductor layer S1, the second nitride semiconductor layer S2, and the third nitride semiconductor layer S3 are sequentially formed. On the center part in the third nitride semiconductor layer 3, the fourth nitride semiconductor layer S4 is formed.

The electron affinity of the second nitride semiconductor layer S2 is equal to or larger than that of the first nitride semiconductor layer S1 (S1≤S2).

The electron affinity of the third nitride semiconductor layer S3 is smaller than that of the first nitride semiconductor layer S1 (S1>S3).

The fourth nitride semiconductor layer S4 is mesa-shaped (mesa shape, projected shape, line shape). The electron affinity of the fourth nitride semiconductor layer S4 is equal to or larger than that of the second nitride semiconductor layer S2 (S4≥S2).

The first nitride semiconductor layer S1 is also called a buffer layer and is made of, for example, AlGaN. The second nitride semiconductor layer S2 is also called a channel layer and is made of, for example, GaN. The third nitride semiconductor layer S3 is called a barrier layer (electron supply layer) and is made of, for example, AlGaN. The Al composition is larger than that of the first nitride semiconductor layer S1. The mesa-shaped fourth nitride semiconductor layer S4 is also called a cap layer and is made of, for example, GaN.

Over the mesa-shaped fourth nitride semiconductor layer (cap layer) S4, a gate electrode GE is formed via a gate insulating film GI. The plane shape of the stack body of the mesa-shaped fourth nitride semiconductor layer (cap layer) S4, the gate insulating film GI, and the gate electrode GE is a rectangular shape having long sides in the Y direction (refer to FIG. 2). The gate electrode extends in the Y direction from over an active region AC to an element isolation region ISO. The length in the X direction of the gate electrode GE (length in the direction in which current flows from the drain electrode to the source electrode, that is, length in the gate length direction) Lg is almost equal to length Lc in the X direction of the mesa-shaped fourth nitride semiconductor layer (cap layer) S4 (Lg≈Lc). The length in the X direction of the gate insulating layer GI is also almost equal to the lengths Lg and Lc.

Over the gate electrode GE, an interlayer insulating film IL1 is formed. On the third nitride semiconductor layer (barrier layer) S3 and on both sides of the mesa-shaped fourth nitride semiconductor layer (cap layer) S4, a source electrode SE and a drain electrode DE are formed. For example, a contact hole C1 is formed in the interlayer insulating film IL1, and the source electrode SE and the drain electrode DE are arranged in and on the contact holes C1.

At the interface between the second nitride semiconductor layer S2 and the third nitride semiconductor layer S3, 2DEG (two-dimensional electron gas) by piezoelectric polarization (due to the lattice constant difference) and intrinsic polarization is generated. Below the gate electrode GE, the mesa-shaped fourth nitride semiconductor layer (cap layer) S4 is provided via the gate insulating film GI. The third nitride semiconductor layer S3 which is in contact with the layer (S4) is influenced by the lattice constant of the fourth nitride semiconductor layer (cap layer) S4, the piezoelectric polarization component in the interface between the second nitride semiconductor layer S2 and the third nitride semiconductor layer S3 decreases, and generation of 2DEG is suppressed. Consequently, only in the case where a predetermined potential (threshold potential) is applied to the gate electrode GE, a channel is formed below the gate electrode GE in which generation of 2DEG is suppressed, and the transistor is turned on. As described above, the transistor of the embodiment has the normally-off characteristic.

In the transistor of the embodiment, as will be described later, the active region AC as a transistor formation region is provided with a projection part ACe projected in the direction of the element isolation region ISO, in a region overlapped with the gate electrode GE in plan view. Consequently, the threshold potential is improved, and the normally-off characteristic can be stably maintained.

Figure 2:
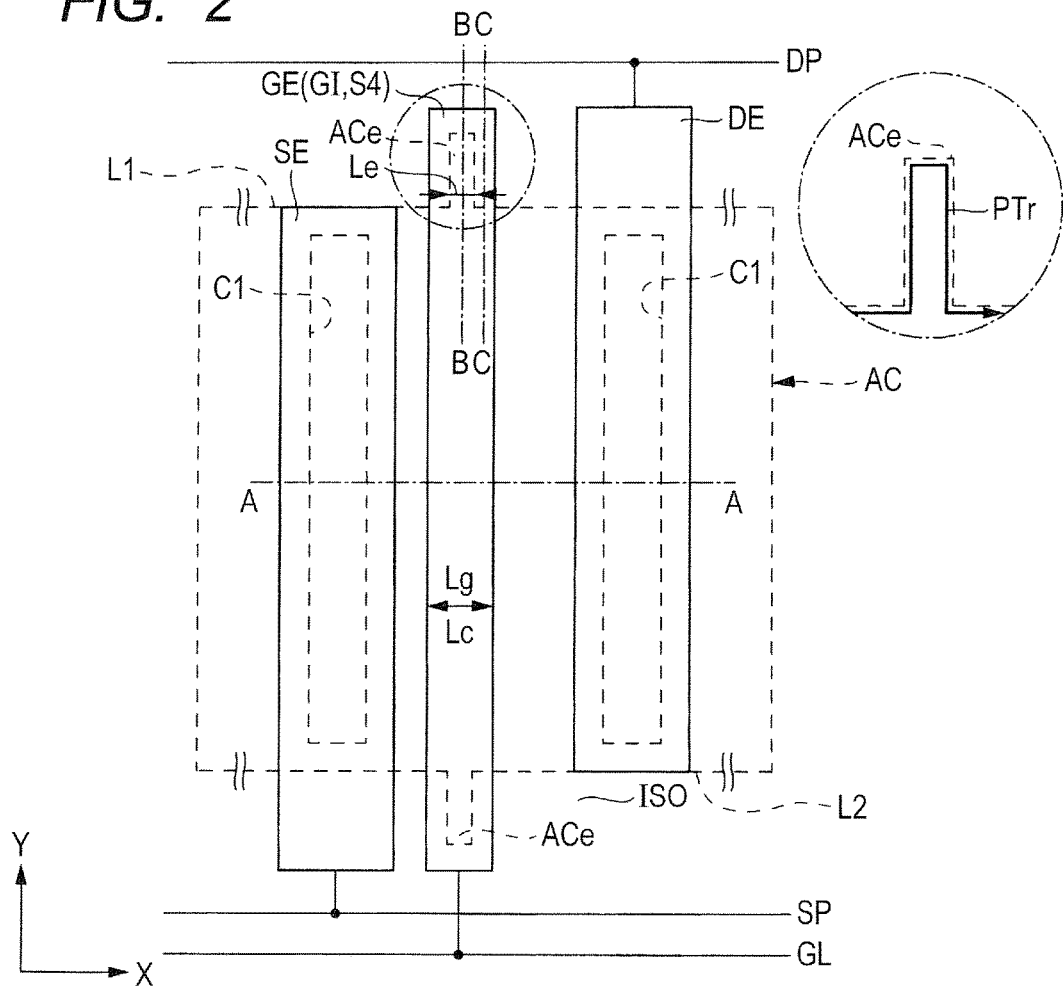
FIG. 2 is a plan view illustrating the structure of the semiconductor device of the first embodiment.
Figure 3:
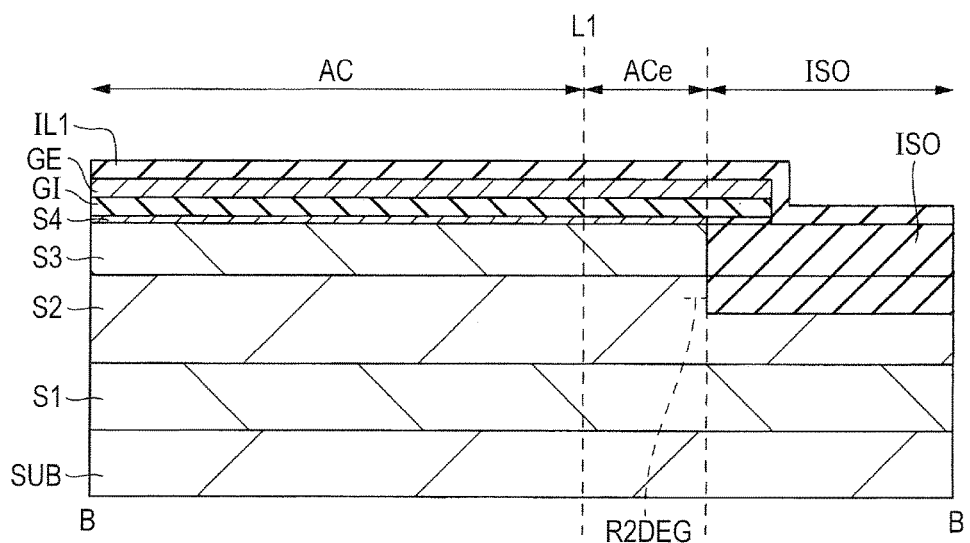
FIG. 3 is a cross section illustrating the structure of the semiconductor device of the first embodiment.
Figure 4:
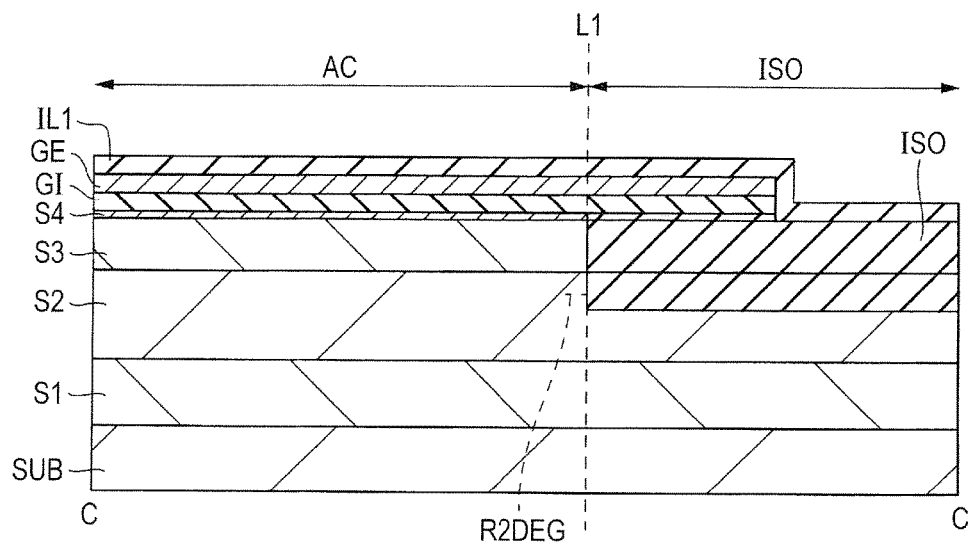
FIG. 4 is a cross section illustrating the structure of the semiconductor device of the first embodiment.
Figure 5:
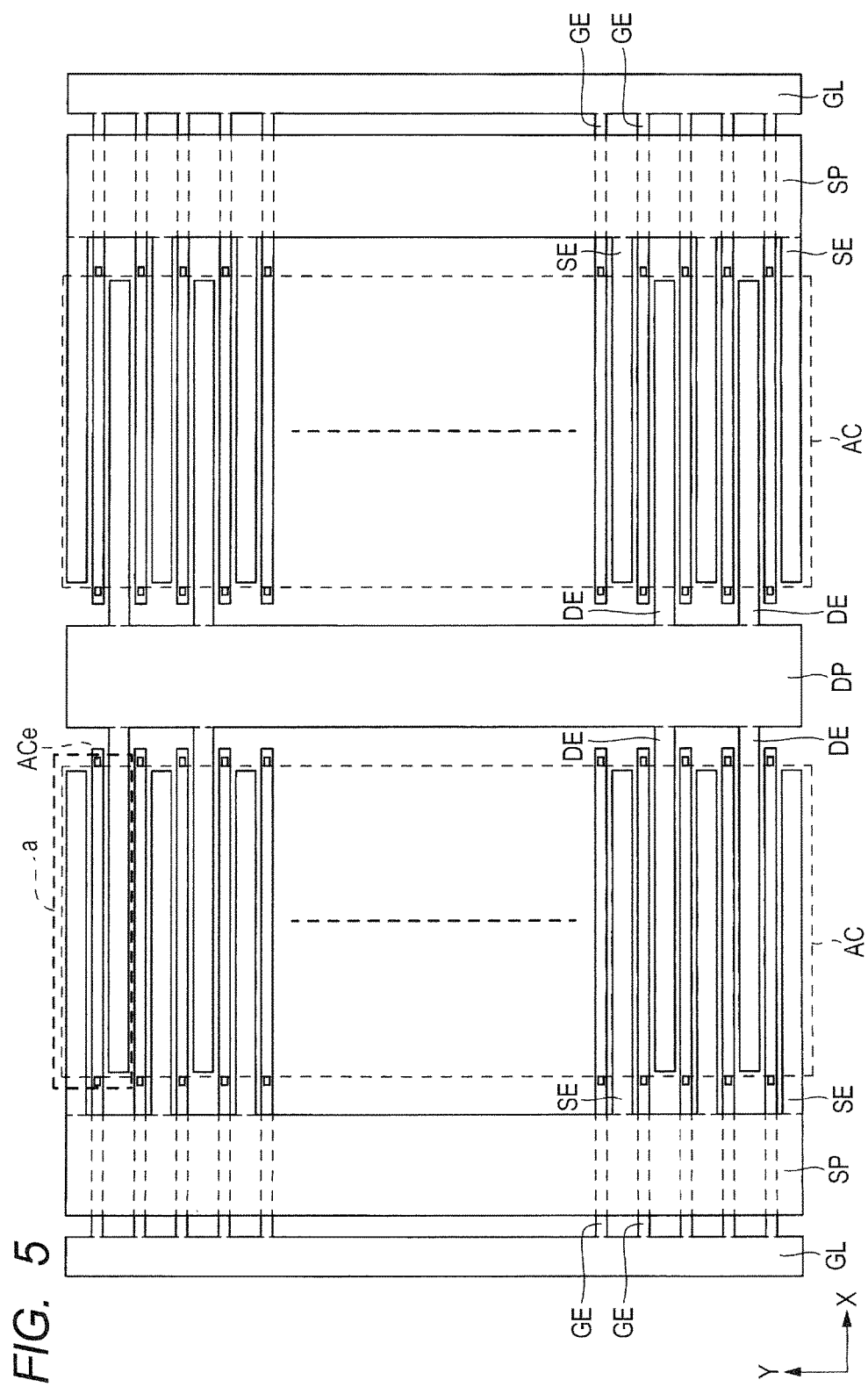
FIG. 5 is a plan view illustrating the structure of the semiconductor device of the first embodiment.

With reference to FIGS. 2 to 5, the semiconductor device of the embodiment will be described more specifically. FIG. 2 is a plan view illustrating the structure of the semiconductor device of the embodiment. FIGS. 3 and 4 are cross sections illustrating the structure of the semiconductor device of the embodiment. FIG. 1 corresponds to the A-A section in FIG. 2, FIG. 3 corresponds to the B-B section in FIG. 2, and FIG. 4 corresponds to the C-C section in FIG. 2. FIG. 5 is a plan view illustrating the structure of the semiconductor device of the embodiment, and FIG. 2 corresponds to a part of FIG. 5 (for example, a region "a" surrounded by a broken line).

As illustrated in FIG. 2, the plane shape of the drain electrode DE is a rectangular shape having long sides in the Y direction. The plane shape of the source electrode SE is a rectangular shape having long sides in the Y direction. Below the drain electrode DE, the contact hole C1 as a coupling part between the drain electrode DE and the third nitride semiconductor layer (barrier layer) S3 is arranged. The plane shape of the contact hole C1 is a rectangular shape having long sides in the Y direction. Below the source electrode SE, the contact hole C1 as a coupling part between the source electrode SE and the third nitride semiconductor layer (barrier layer) S3 is arranged. The plane shape of the contact hole C1 is a rectangular shape having long sides in the Y direction.

Between the contact hole C1 below the drain electrode DE and the contact hole C1 below the source electrode SE, the gate electrode GE is arranged. As described above, the gate electrode GE has the rectangular shape having long sides in the Y direction.

A plurality of sets each made of the drain electrode DE, the gate electrode GE, and the source electrode SE illustrated in FIG. 2 are arranged repeatedly as illustrated in FIG. 5.

As illustrated in FIG. 5, the plane shape of the drain electrode DE is a rectangular shape having long sides in the Y direction. A plurality of line-shaped drain electrodes DE are arranged at predetermined intervals in the X direction. The plane shape of the source electrode SE is a rectangular shape having long sides in the Y direction. A plurality of line-shaped source electrodes SE are arranged at predetermined intervals in the X direction. The plurality of source electrodes SE and the plurality of drain electrodes DE are arranged alternately in the X direction. Between the contact hole C1 below the drain electrode DE and the contact hole C1 below the source electrode SE, the gate electrode GE is arranged.

A plurality of drain electrodes DE are coupled by a drain pad (also called a terminal part) DP. The drain pad DP is arranged so as to extend in the X direction on the one end side of the drain electrode DE (the center part in FIG. 5). In other words, the plurality of drain electrodes DE are arranged so as to project in the Y direction from the drain pad DP extending in the X direction. Such a shape is also called a comb shape.

A plurality of source electrodes SE are coupled by a source pad (also called a terminal part) SP. The source pad SP is arranged so as to extend in the X direction on the other end side (the left side in FIG. 5) of the source electrode SE. In other words, the plurality of source electrodes SE are arranged so as to extend in the Y direction from the source pad SP extending in the X direction. Such a shape is also called a comb shape.

The plurality of gate electrodes GE are coupled by a gate line GL. The gate line GL is arranged so as to extend in the X direction on one end side (the left side in FIG. 5) of the gate electrode GE. In other words, the plurality of gate electrodes GE are arranged so as to project in the Y direction from the gate line GL extending in the X direction. The gate line GL is coupled to, for example, gate pads (not illustrated) provided on both sides in the X direction of the gate line GL (in FIG. 5, the upper or lower side).

Below in the cross section of the gate electrode GE and the gate line GL, the mesa-shaped fourth nitride semiconductor layer (cap layer) S4 is arranged via the gate insulating film GI.

The gate lines GL, the gate electrodes GE, the source pads SP, the source electrodes SE, and the drain electrodes DE are arranged bilaterally symmetrically with respect to the drain pad DP in the center of FIG. 5 as an axis.

The source electrodes SE, the drain electrodes DE, and the gate electrodes GE are arranged mainly over the active region AC surrounded by the element isolation region ISO. The plane shape of the active region AC is an almost rectangular shape having long sides in the X direction. On the other hand, the drain pad DP, the gate lines GL, and the source pads SP are arranged over the element isolation region ISO. The source pad SO is arranged between the active region AC and the gate line GL. The element isolation region ISO is a high-resistive region in which the crystalline nature is destroyed in the nitride semiconductor layer by ion implantation or the like. The high-resistive region functions as an element isolation region and its resistance is higher than, at least, that of the active region AC.

In the embodiment, as illustrated in FIGS. 2 and 5, the active region AC as a transistor formation region is provided with the projection part (projection region) ACe. Specifically, as illustrated in FIG. 2, the projection part (projection region) ACe is provided in the region where the active region AC and the gate electrode GE are overlapped in plan view. More concretely, the active region AC has an almost rectangular shape and has the projection part ACe projected from the line L1 as the end part. The line L1 is a line extending in the X direction and is, for example, a line near the end part of the source electrode SE. It also has the projection part ACe projected from the line L2. The line L2 is a line extending in the X direction and is, for example, a line near the end part of the drain electrode DE.

The length in the X direction of the projection part ACe (the direction in which current flows from the drain electrode to the source electrode, that is, the length in the gate length direction) Le is smaller than the length Lg (for example, about 2 μm) in the X direction of the gate electrode GE. For example, the length Le in the X direction of the projection part ACe is about 1 μm, and the length in the Y direction of the projection part ACe is about 1.8 μm.

As described above, by providing the active region AC with the projection part (projection region) ACe, even when residual 2DEG (R2DEG) is generated as illustrated in FIGS. 3 and 4 at the border between the active region AC and the element isolation region ISO and a parasitic transistor is generated, since the channel length of the parasitic transistor is long, turn-on of the parasitic transistor can be suppressed.

Figure 6:
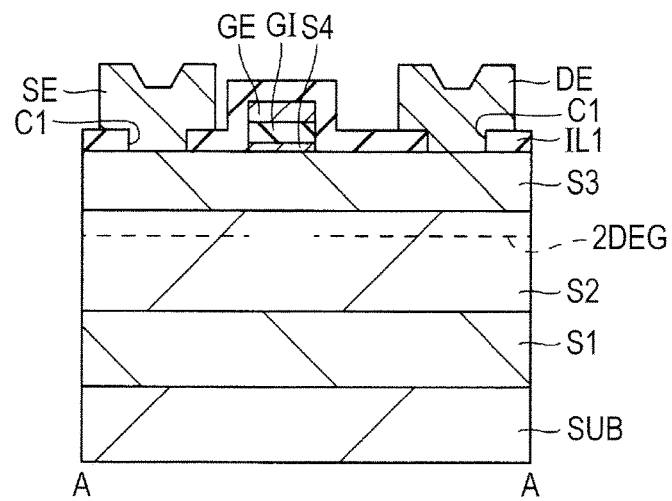
FIG. 6 is a cross section illustrating the structure of a semiconductor device of a comparative example of the first embodiment.
Figure 7:
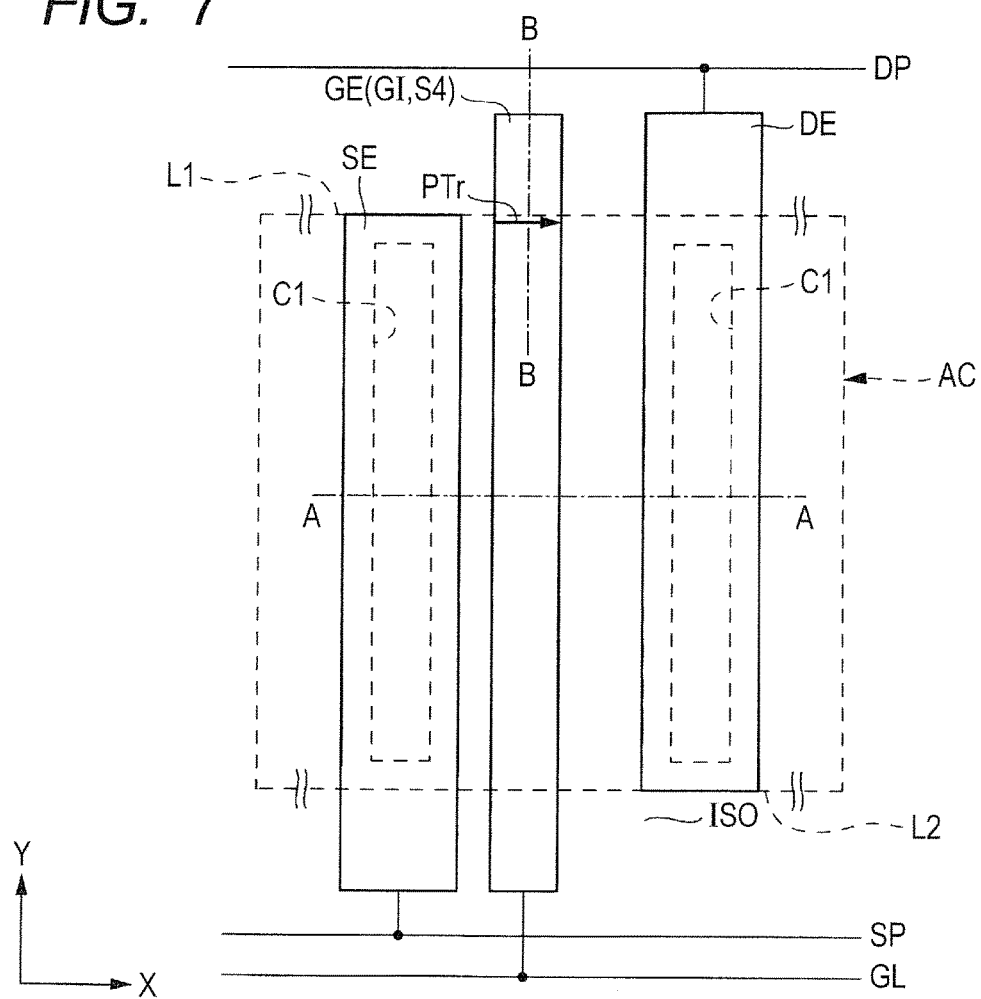
FIG. 7 is a plan view illustrating the structure of the semiconductor device of the comparative example of the first embodiment.
Figure 8:
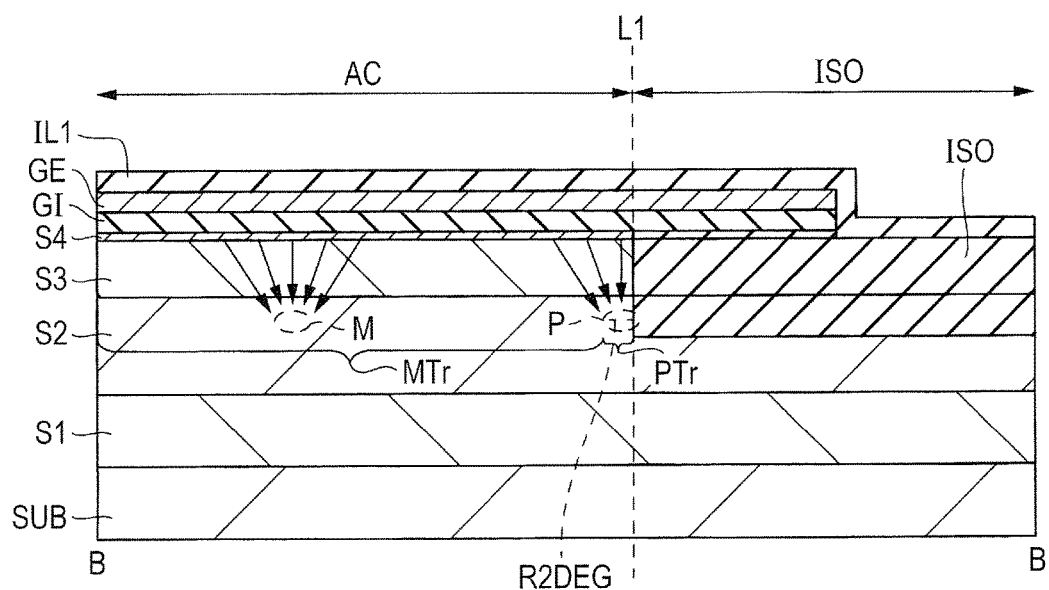
FIG. 8 is a cross section illustrating the structure of the semiconductor device of the comparative example of the first embodiment.
Figure 9:
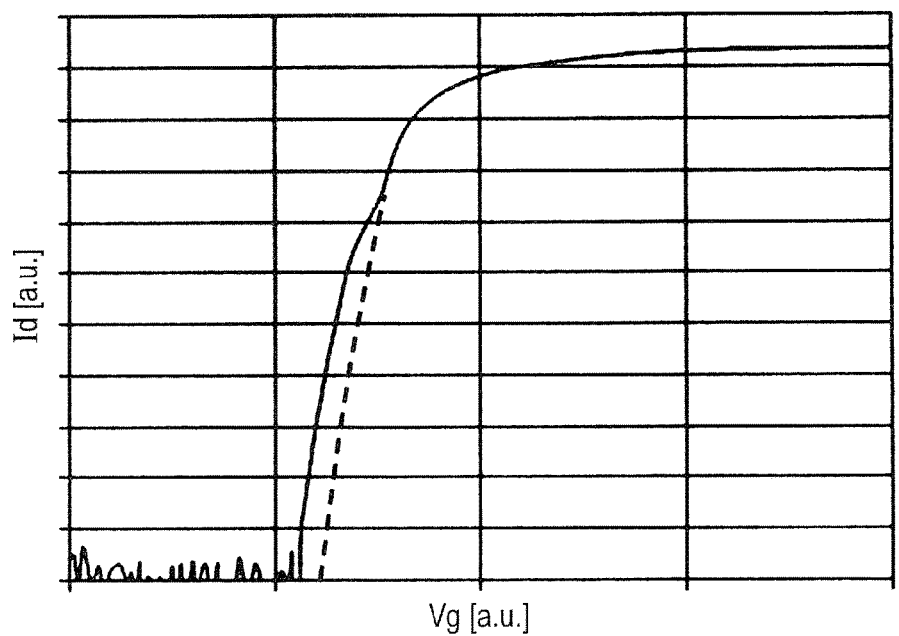
FIG. 9 is a diagram illustrating an Id-Vg waveform of the semiconductor device of the comparative example.
Figure 10:
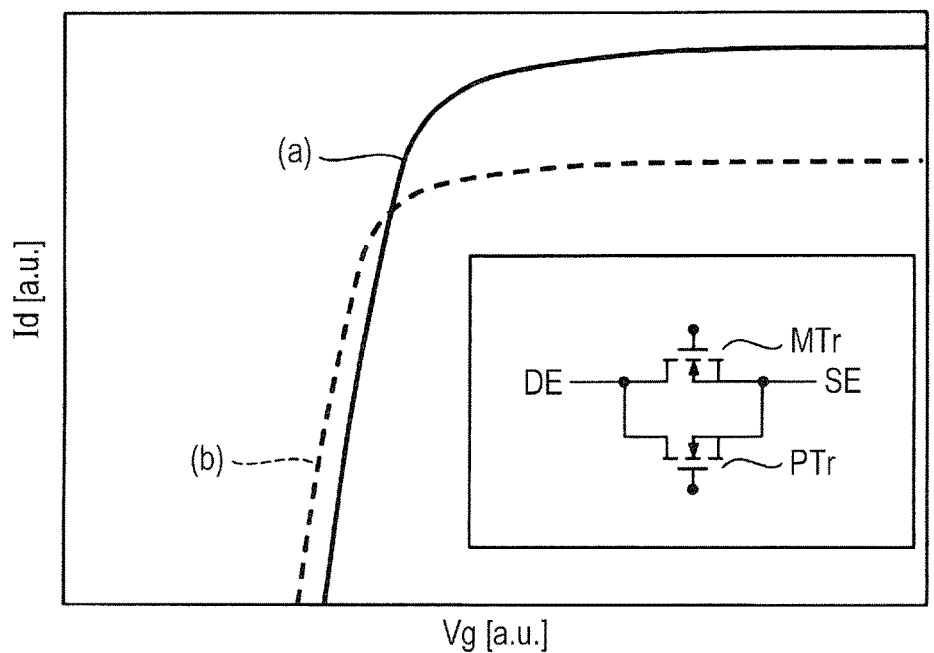
FIG. 10 is a diagram illustrating an Id-Vg waveform of the semiconductor device of the comparative example.
Figure 11:
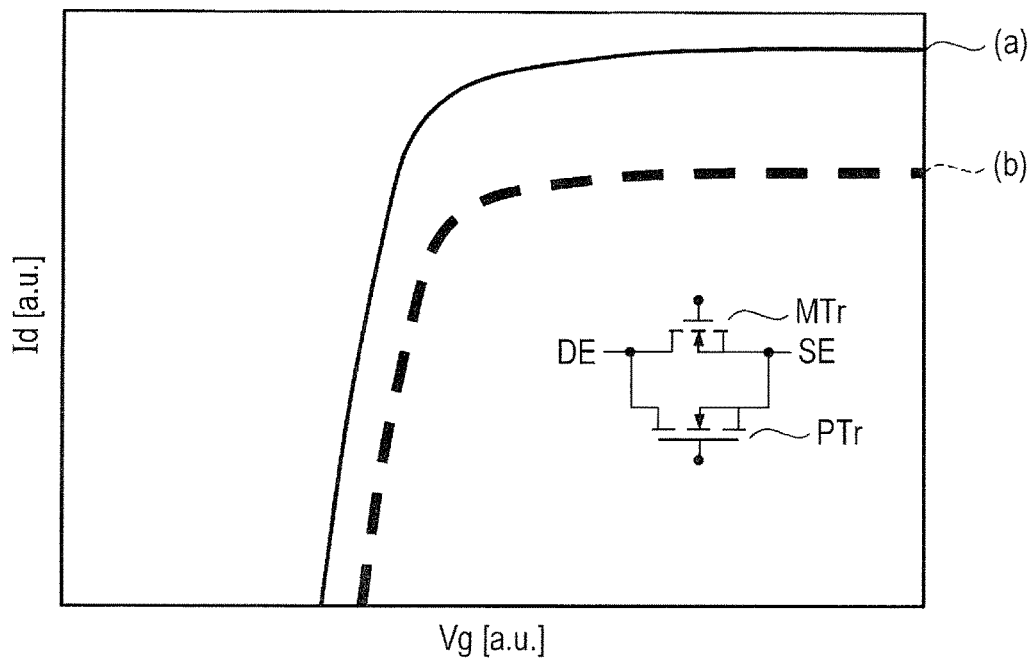
FIG. 11 is a diagram schematically illustrating an Id-Vg waveform of the semiconductor device of the first embodiment.
Figure 12:
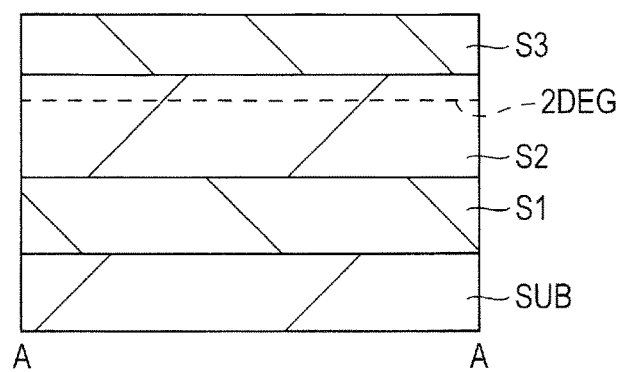
FIG. 12 is a cross section illustrating a process of manufacturing the semiconductor device of the first embodiment.
Figure 13:
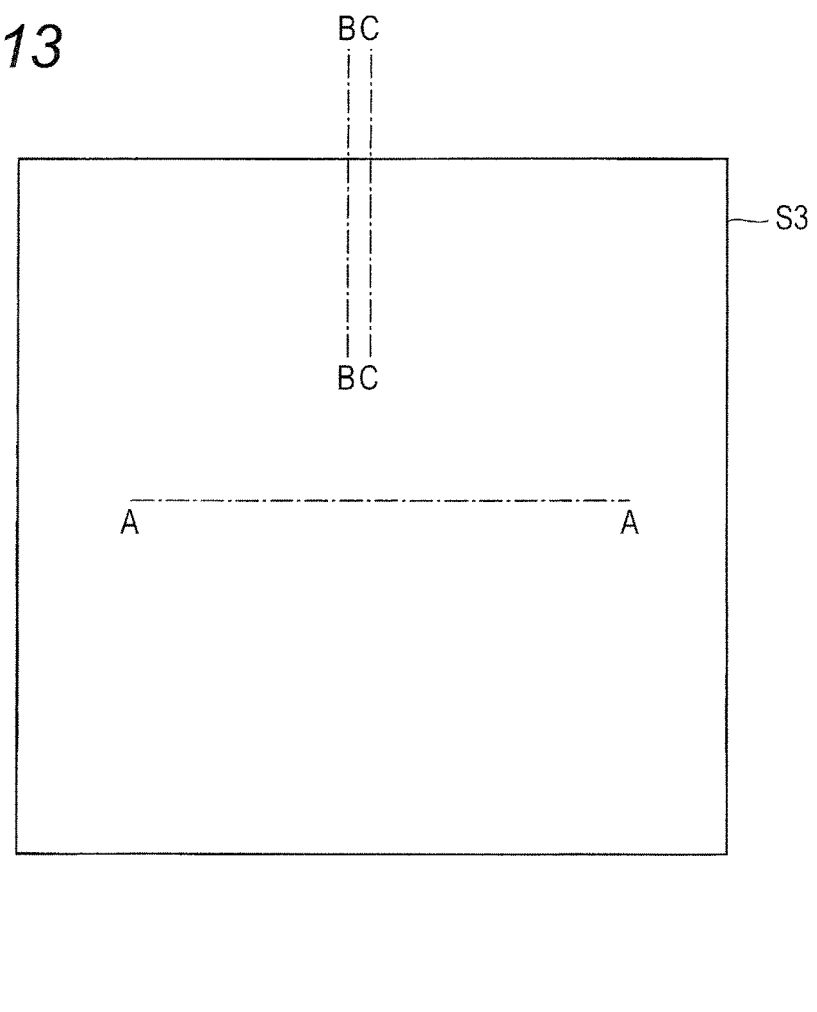
FIG. 13 is a plan view illustrating a process of manufacturing the semiconductor device of the first embodiment.
Figure 14:
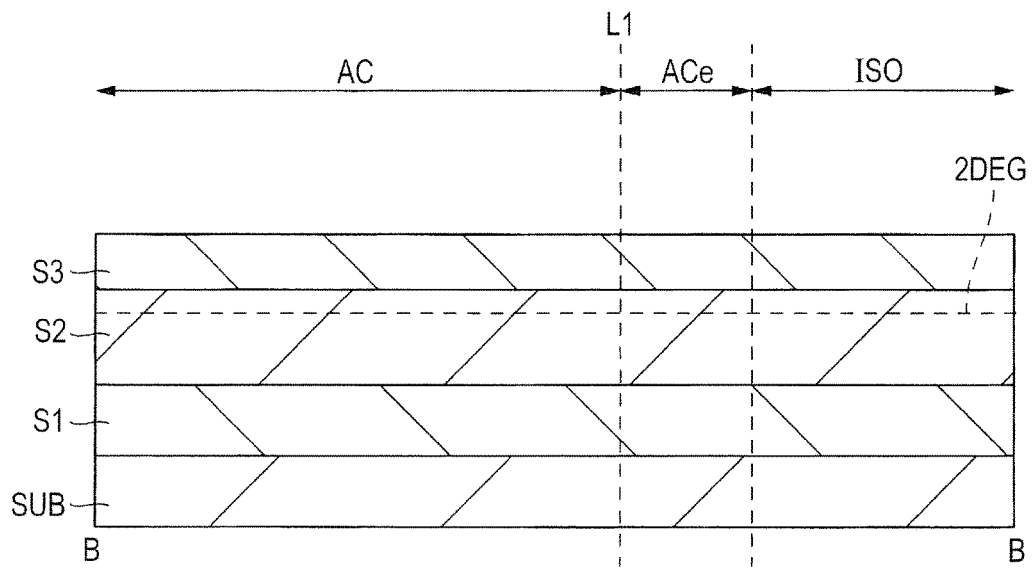
FIG. 14 is a cross section illustrating a process of manufacturing the semiconductor device of the first embodiment.
Figure 15:
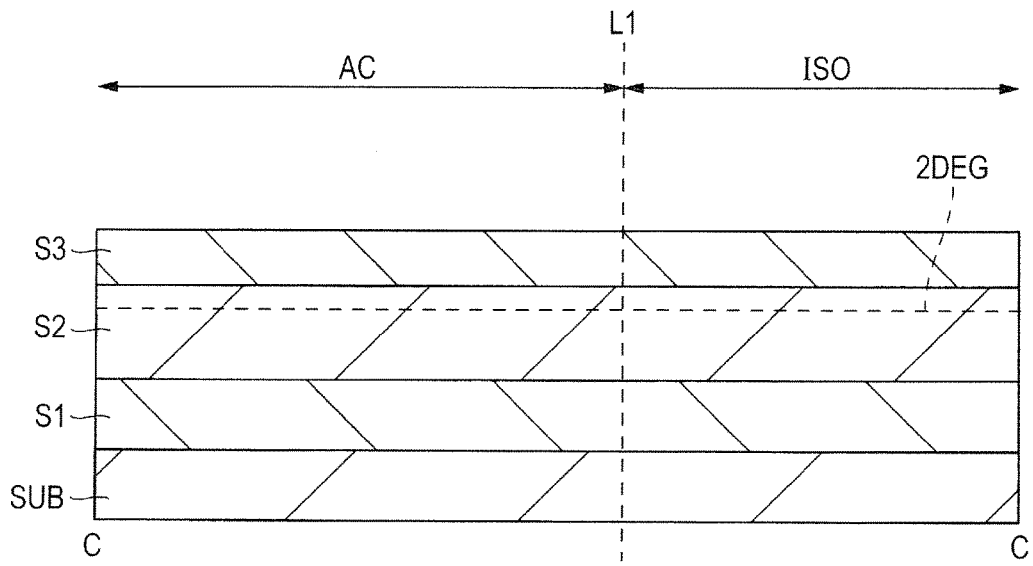
FIG. 15 is a cross section illustrating a process of manufacturing the semiconductor device of the first embodiment.
Figure 16:
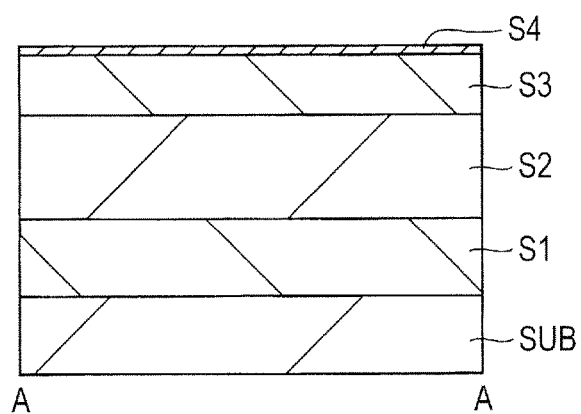
FIG. 16 is a cross section illustrating a process of manufacturing the semiconductor device of the first embodiment.
Figure 17:
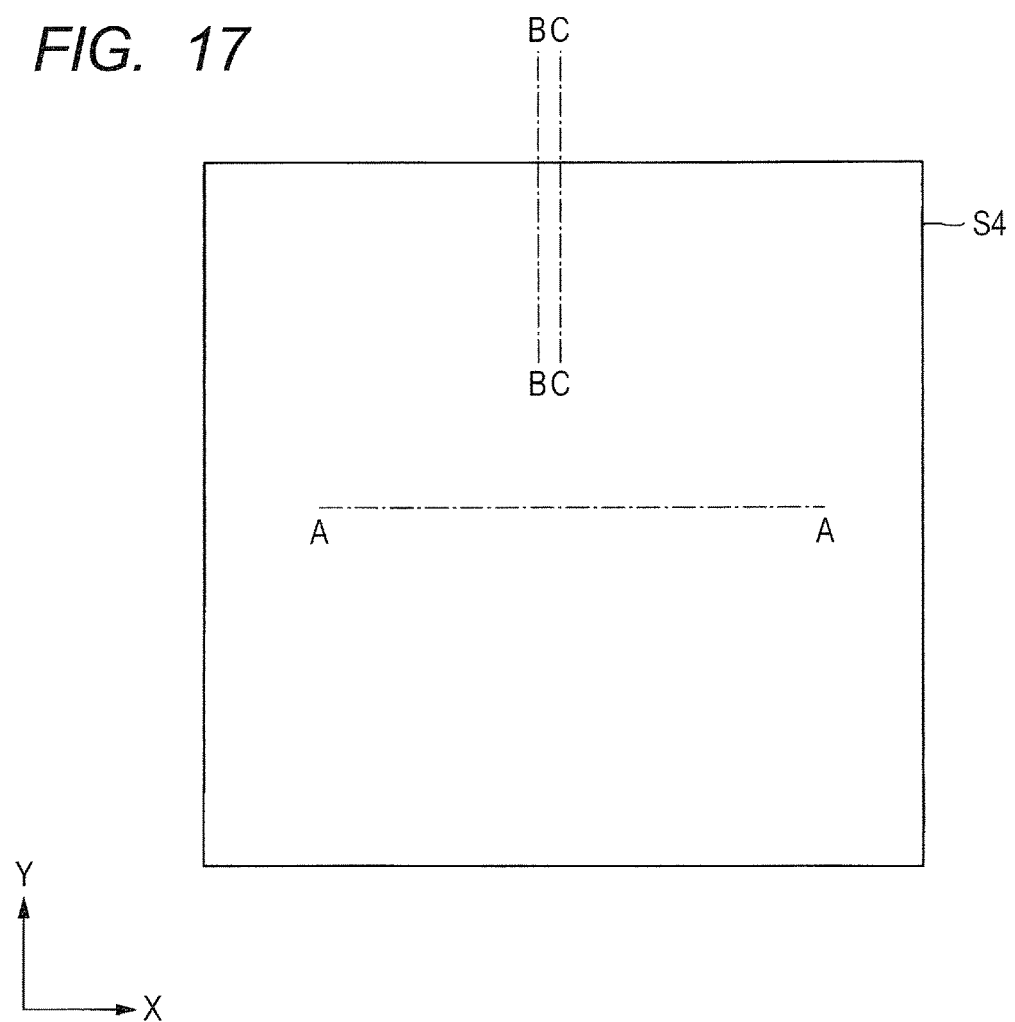
FIG. 17 is a plan view illustrating a process of manufacturing the semiconductor device of the first embodiment.
Figure 18:
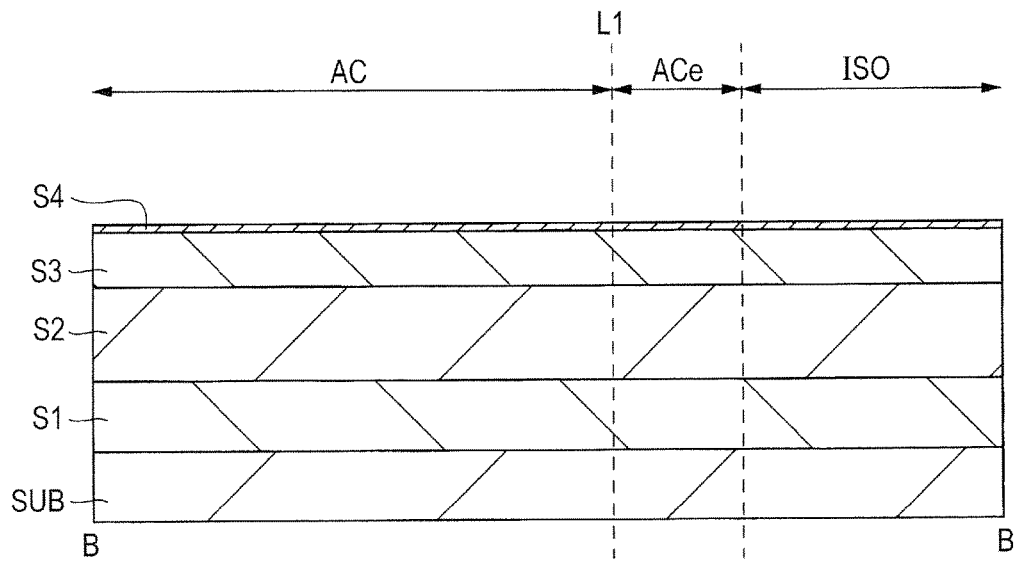
FIG. 18 is a cross section illustrating a process of manufacturing the semiconductor device of the first embodiment.
Figure 19:
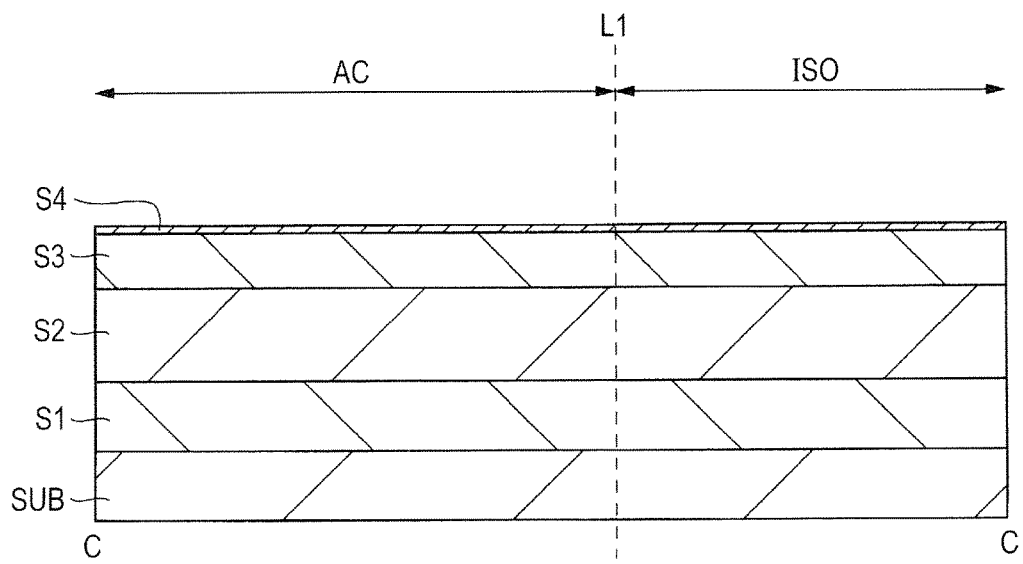
FIG. 19 is a cross section illustrating a process of manufacturing the semiconductor device of the first embodiment.
Figure 20:
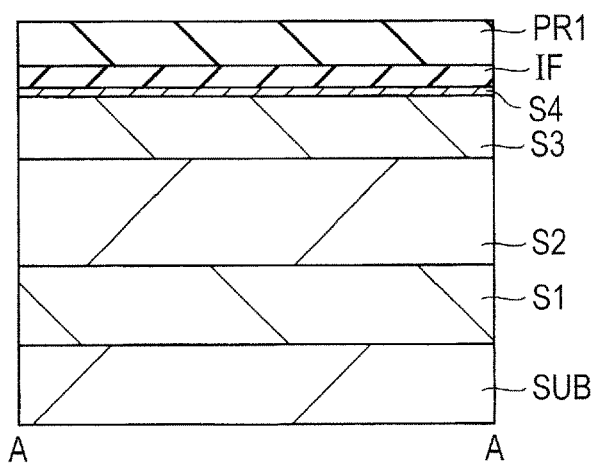
FIG. 20 is a cross section illustrating a process of manufacturing the semiconductor device of the first embodiment.

FIGS. 6 to 8 are illustrating the structure of a semiconductor device of a comparative example. FIG. 6 is a cross section, FIG. 7 is a plan view, and FIG. 8 is a cross section. FIG. 6 corresponds to the A-A section in FIG. 7, and FIG. 8 corresponds to the B-B section in FIG. 7. FIGS. 9 and 10 are diagrams each illustrating an Id-Vg waveform of the semiconductor device (transistor) of the comparative example. FIG. 11 is a diagram schematically illustrating the Id-Vg waveform of the semiconductor device (transistor) of the embodiment. Id denotes drain current, and Vg denotes gate potential.

When a projection part (ACe) is not provided for the active region AC like in the semiconductor device (transistor) of the comparative example illustrated in FIGS. 6 to 8, as illustrated by the solid line in FIG. 9, humps are seen in the Id-Vg waveform of the transistor. The broken line in FIG. 9 indicates an Id-Vg waveform of a transistor having an excellent characteristic. As illustrated in FIG. 10, the Id-Vg waveform having such humps is considered as a composite waveform of a graph (a) as the Id-Vg waveform of a main transistor MTr and a graph (b) as the Id-Vg waveform of a parasitic transistor PTr. Specifically, it is considered as follows. The parasitic transistor PTr coupled to the main transistor MTr in parallel is generated. The parasitic transistor PTr in which the threshold potential is low and the channel width is small is turned on first and, after that, the main transistor Tr in which the threshold is higher and the channel width is larger is turned on. As a result, the drain current (Id) flows out prior to the threshold potential which is set in the main transistor MTr, and the threshold potential decreases.

Generation of such a parasitic transistor PTr can be considered as follows. As illustrated in FIG. 8, just below the gate electrode GE, usually, generation of 2DEG is suppressed by the influence of the fourth nitride semiconductor layer (cap layer) S4, and the threshold potential is high. That is, in the formation region of the main transistor MTr, as illustrated in a region M surrounded by the broken line, the influence of the fourth nitride semiconductor layer (cap layer) S4 is exerted in the directions of 180 degrees indicated by the arrows in the diagram using the region M as a center. Consequently, the state is considered as a state where the threshold potential is sufficiently increased.

In contrast, around the border between the active region AC and the element isolation region ISO, in the active region AC, the fourth nitride semiconductor layer (cap layer) S4 exerts an influence on the piezoelectric polarization of the third nitride semiconductor layer (barrier layer) S3 by the lattice constant difference. In the element isolation region ISO, the crystalline nature of the fourth nitride semiconductor layer S4 is destroyed or removed, so that there is no influence on the piezoelectric polarization from the fourth nitride semiconductor layer (cap layer) S4 in the element isolation region ISO. That is, a region P surrounded by the broken line at the border between the active region AC and the element isolation region ISO is influenced by the fourth nitride semiconductor layer (cap layer) S4 only from the direction of 90 degrees indicated by the arrows in the diagram. As described above, around the border between the active region AC and the element isolation region ISO, the piezoelectric polarization suppressing effect becomes the half of that in the formation region of the main transistor MTr, and the residual 2DEG (R2DEG) is generated. The residual 2DEG (R2DEG) refers to a region, as described above, in which the piezoelectric polarization suppressing effect by the cap layer is insufficient, that is, a channel of a different threshold, and denotes a region in which a channel is formed at a potential lower than that in the other areas when potential is applied to the gate electrode.

As described above, the region in which the threshold potential cannot be sufficiently increased is generated around the border between the active region AC and the element isolation region ISO, and it becomes the parasitic transistor PTr having low threshold potential and narrow channel width (FIG. 7).

On the other hand, in the embodiment, as illustrated in FIG. 2, even when the residual 2DEG (R2DEG) is generated around the border between the active region AC and the element isolation region ISO, the length of the border (effective region, channel region) between the active region AC and the element isolation region ISO becomes longer than the channel length of the main transistor MTr, so that the parasitic transistor PTr is not easily turned on. Consequently, for example, as illustrated in FIG. 11, the graph (b) as the Id-Vg waveform of the parasitic transistor PTr shifts to the right side so as to be on the inside of the graph (a) as the Id-Vg waveform of the main transistor MTr, so that humps as illustrated in the graph of the solid line in FIG. 9 can be solved.

As described above, in the embodiment, humps in the Id-Vg waveform are reduced, decrease in the threshold potential is suppressed, and the normally-off characteristic can be stabilized.

Description of Manufacturing Method

Subsequently, with reference to FIGS. 12 to 35, a method of manufacturing a semiconductor device of the embodiment will be described, and the structure of the semiconductor device will be more clarified. FIGS. 12 to 35 are cross sections and plan views illustrating processes of manufacturing the semiconductor device of the embodiment.

As illustrated in FIGS. 12 to 15, the substrate SUB is prepared, and the first to third nitride semiconductor layers are sequentially formed. As the substrate SUB, for example, a semiconductor substrate made of silicon (Si) whose (111) plane is exposed is used. As the substrate SUB, a substrate made of silicon as described above, SiC, sapphire, or the like may be also used. A substrate made of GaN may be also used. Usually, all of nitride semiconductor layers (III-V group compound semiconductor layers) formed after that over the substrate SUB are formed by III-group element surface growth (specifically, in this case, gallium surface growth or aluminum surface growth). Over the substrate SUB, a nucleation layer and a high-resistive buffer layer are formed and, after that, first to third nitride semiconductor layers may be sequentially formed. As the nucleation layer, for example, an aluminum nitride (AlN) layer can be used. This layer can be formed by, for example, epitaxial growth using the metal organic chemical vapor deposition (MOCVD). As the high-resistive buffer layer, a superlattice structure obtained by repeatedly stacking a stack-layer film (AlN/GaN film) of a gallium nitride (GaN) layer and an aluminum nitride (AlN) film can be used. The superlattice structure can be formed by, for example, epitaxially growing the gallium nitride (GaN) layer and the aluminum nitride (AlN) layer alternately by the organic metal vapor phase growth.

Over the substrate SUB, an AlGaN layer is epitaxial-grown about 1000 nm as a first nitride semiconductor layer (buffer layer) S1 by using the organic metal vapor phase growth or the like. Regarding the constituent element ratio of the AlGaN layer, for example, in the case of $Al_xGa_{1-x}N$, X is set to be equal to or larger than 0 and equal to or less than 0.1 ($0 \leq X \leq 0.1$). The AlGaN layer is, for example, a non-doped layer. That is, n-type impurity or p-type impurity is not intentionally doped.

On the first nitride semiconductor layer S1, a GaN layer is epitaxial-grown about 50 nm as a second nitride semiconductor layer (channel layer) S2 by using the organic metal vapor phase growth or the like.

On the second nitride semiconductor layer S2, an AlGaN layer is epitaxial-grown about 20 nm as a third nitride semiconductor layer (barrier layer) S3 by using the organic metal vapor phase growth or the like. Regarding the constituent element ratio of the AlGaN layer, for example, in the case of $Al_zGa_{1-z}N$, Z is set to be larger than X and less than 0.4 ($X<Z<0.4$).

At this time, as described above, 2DEG (two-dimensional electron gas) is generated at the interface between the second nitride semiconductor layer (channel layer) S2 and the third nitride semiconductor layer (barrier layer) S3.

As illustrated in FIGS. 16 to 19, on the third nitride semiconductor layer S3, a GaN layer is epitaxial-grown about 100 nm as a fourth nitride semiconductor layer (cap layer) S4 by using the organic metal vapor phase growth or the like. By the formation of the fourth nitride semiconductor layer (cap layer) S4, the 2DEG dissipates.

As illustrated in FIGS. 20 to 23, a photoresist film PR1 having an opening for the element isolation region is formed over the fourth nitride semiconductor layer (cap layer) S4 via a protection film (for example, silicon oxide film) IF by the photolithography process. By implanting boron ions using the photoresist film PR1 as a mask, the element isolation region ISO is formed. When an ion species such as boron (B) or nitrogen (N) is implanted, the crystal state changes, and resistance becomes higher.

Figure 21:
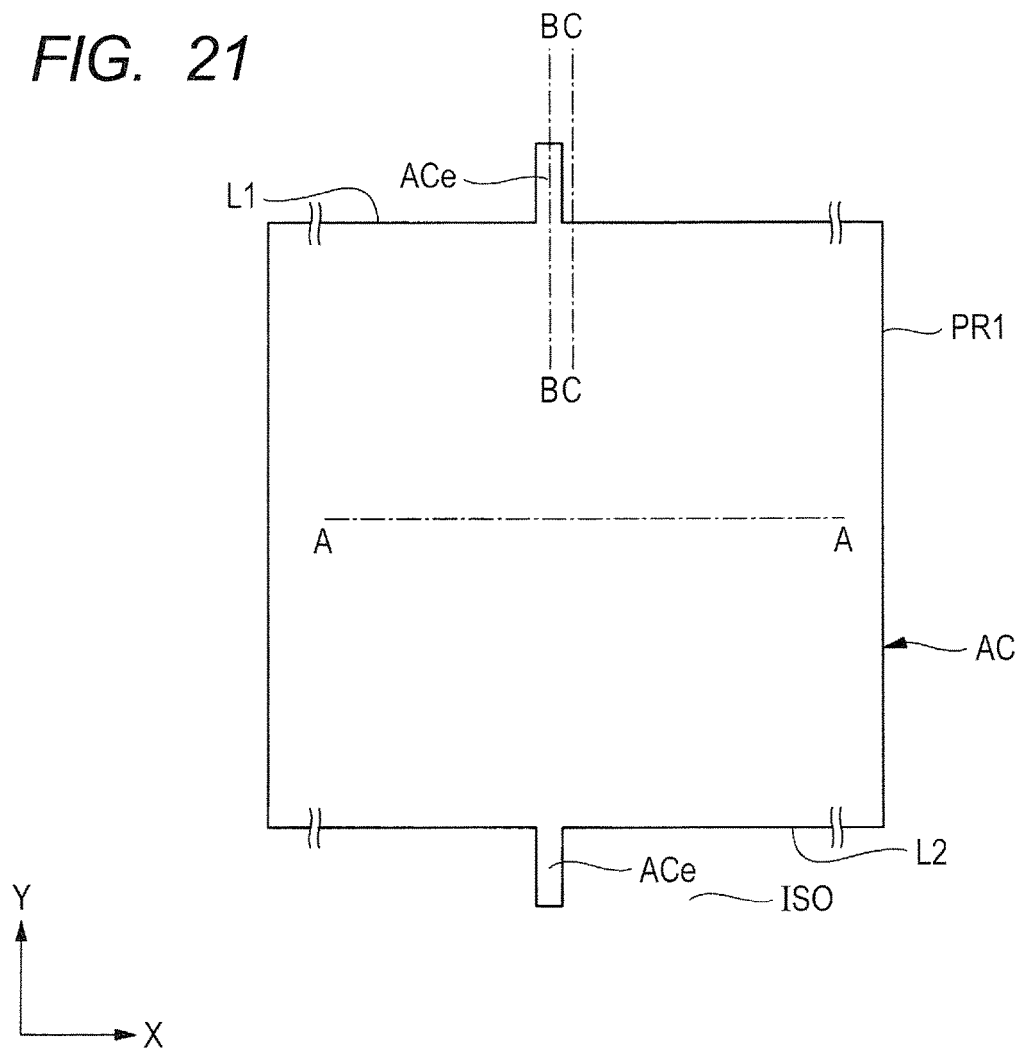
FIG. 21 is a plan view illustrating a process of manufacturing the semiconductor device of the first embodiment.
Figure 22:
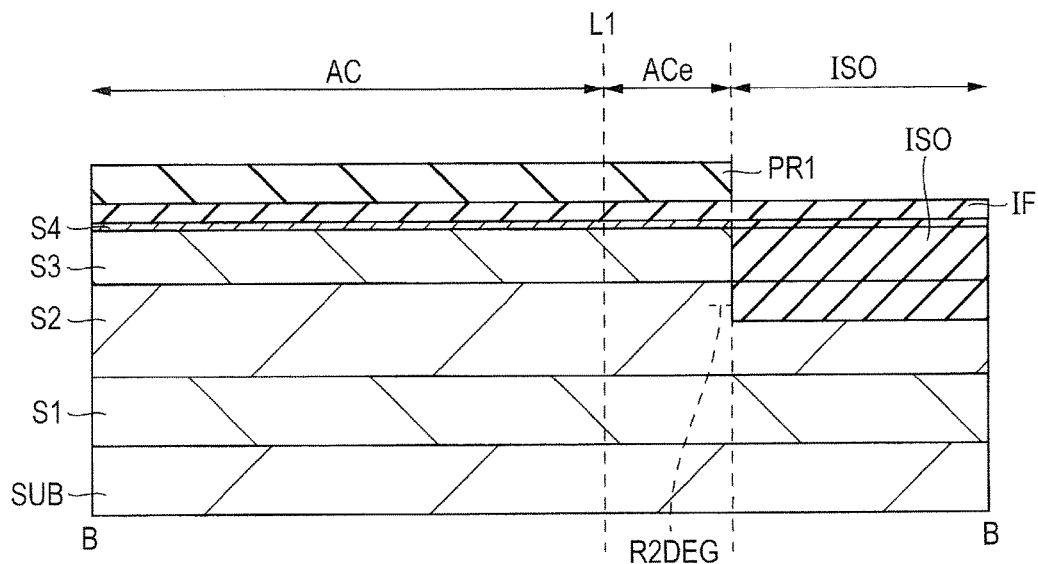
FIG. 22 is a cross section illustrating a process of manufacturing the semiconductor device of the first embodiment.
Figure 23:
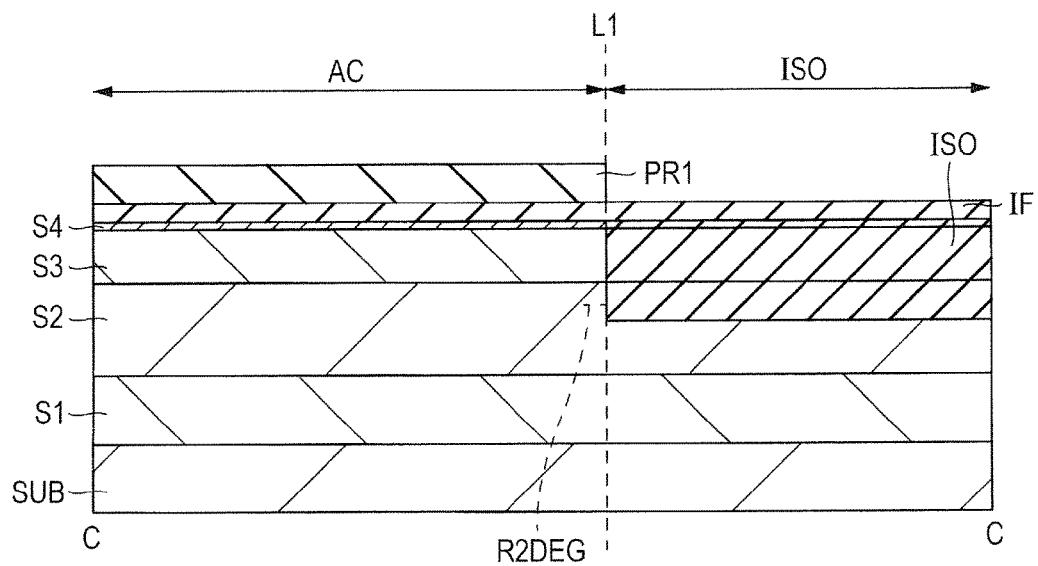
FIG. 23 is a cross section illustrating a process of manufacturing the semiconductor device of the first embodiment.
Figure 24:
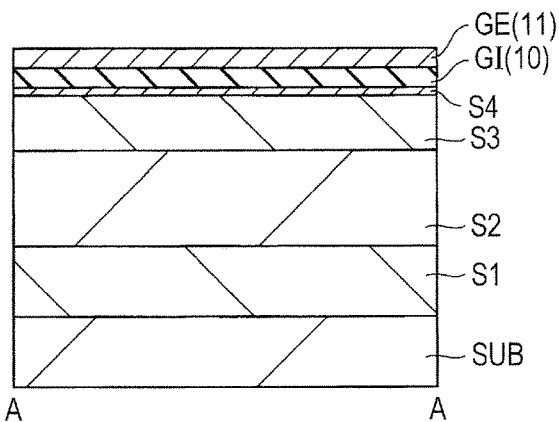
FIG. 24 is a cross section illustrating a process of manufacturing the semiconductor device of the first embodiment.
Figure 25:
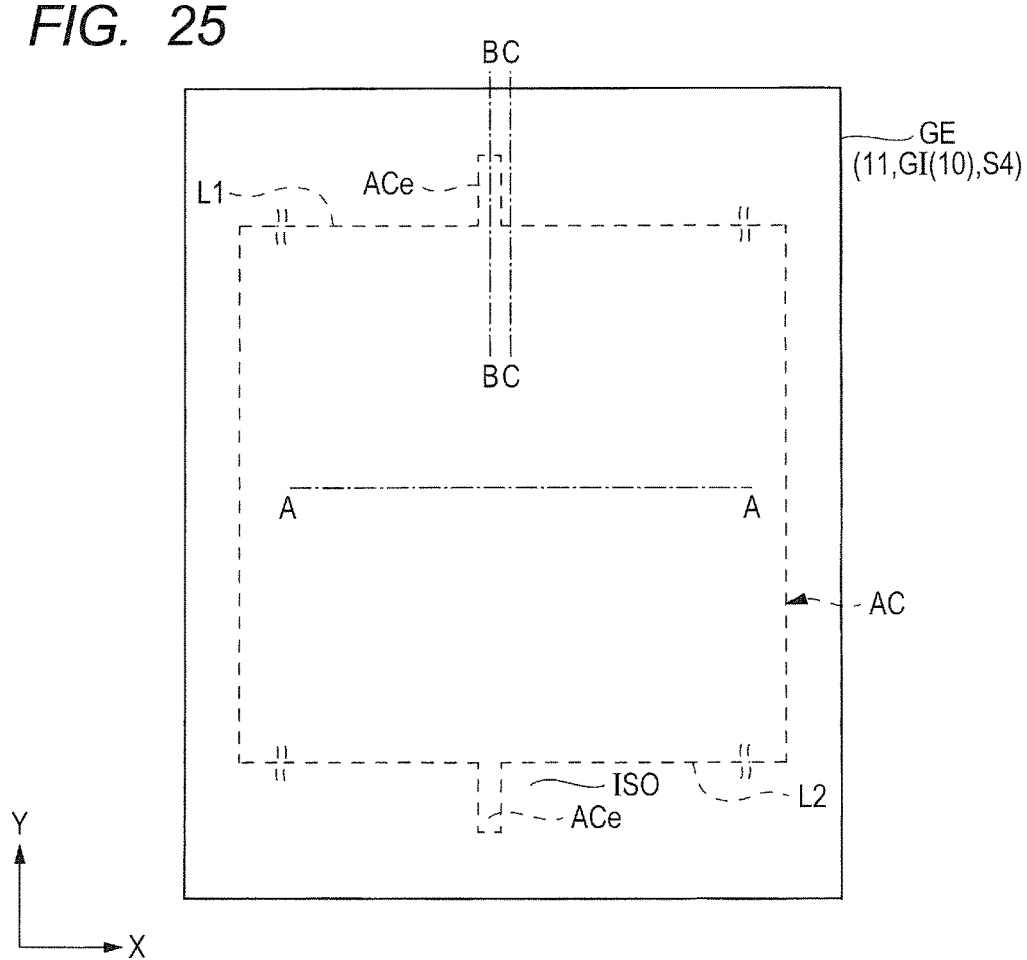
FIG. 25 is a plan view illustrating a process of manufacturing the semiconductor device of the first embodiment.
Figure 26:
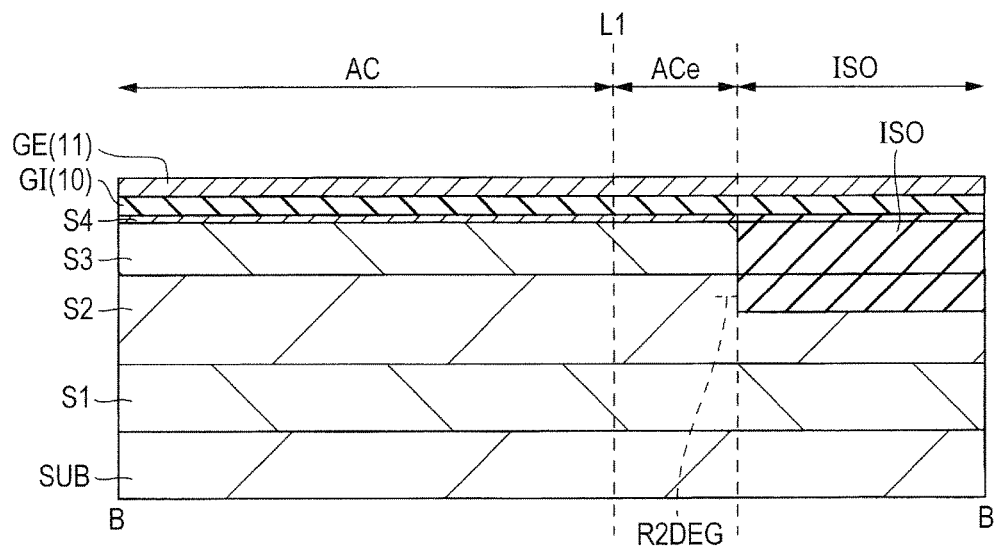
FIG. 26 is a cross section illustrating a process of manufacturing the semiconductor device of the first embodiment.
Figure 27:
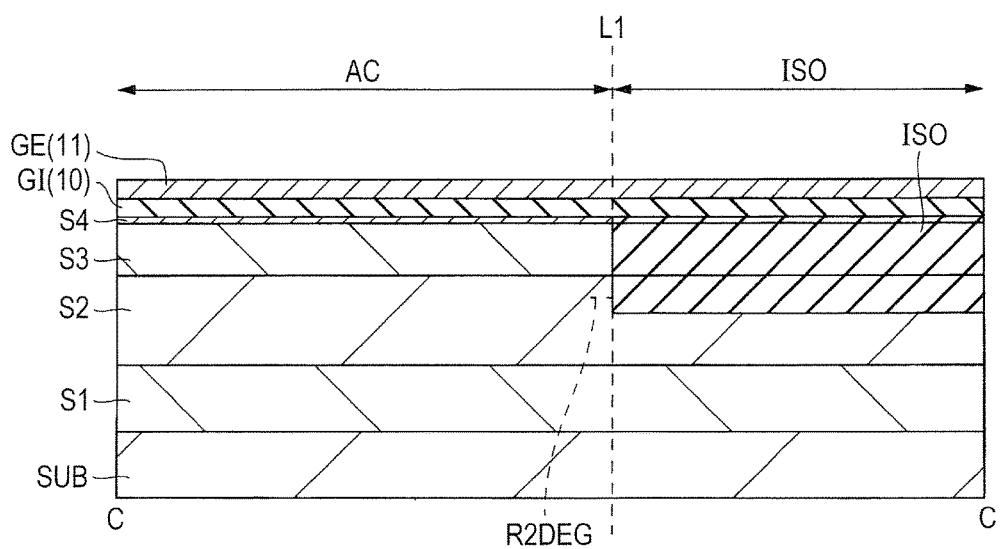
FIG. 27 is a cross section illustrating a process of manufacturing the semiconductor device of the first embodiment.
Figure 28:
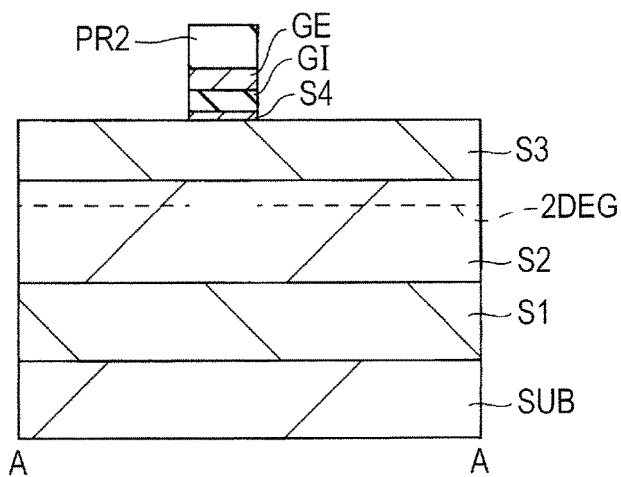
FIG. 28 is a cross section illustrating a process of manufacturing the semiconductor device of the first embodiment.
Figure 29:
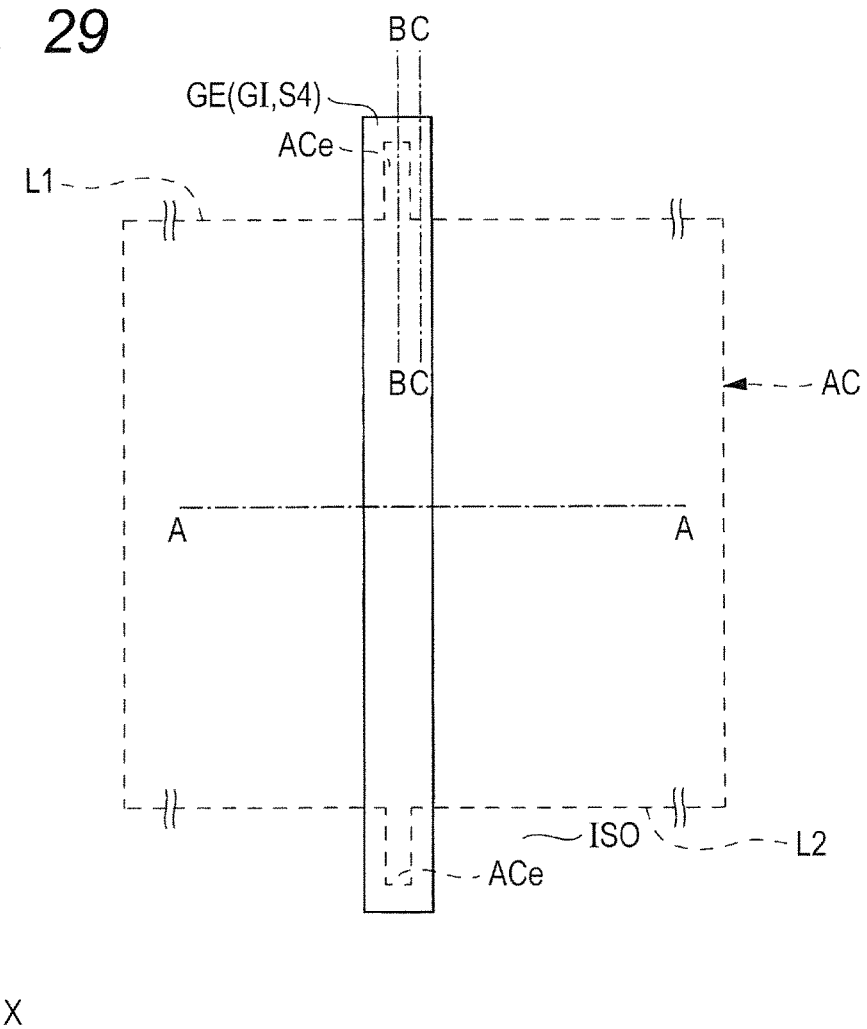
FIG. 29 is a plan view illustrating a process of manufacturing the semiconductor device of the first embodiment.
Figure 30:
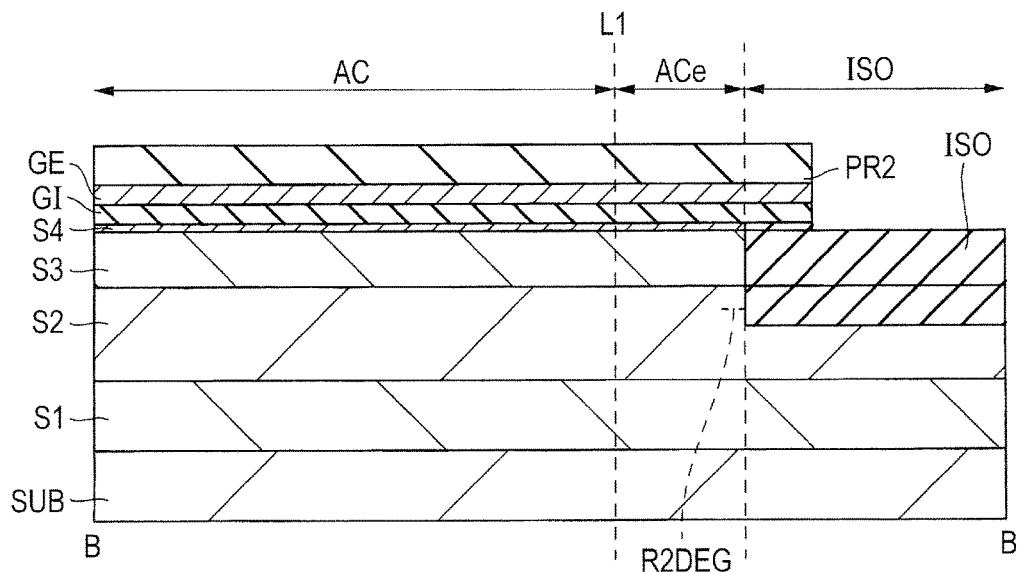
FIG. 30 is a cross section illustrating a process of manufacturing the semiconductor device of the first embodiment.
Figure 31:
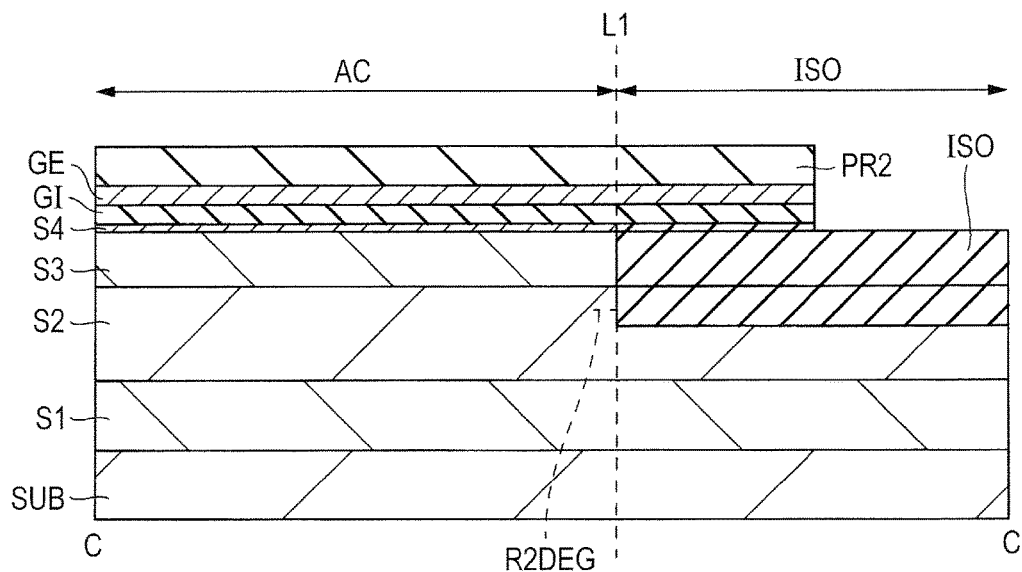
FIG. 31 is a cross section illustrating a process of manufacturing the semiconductor device of the first embodiment.
Figure 32:
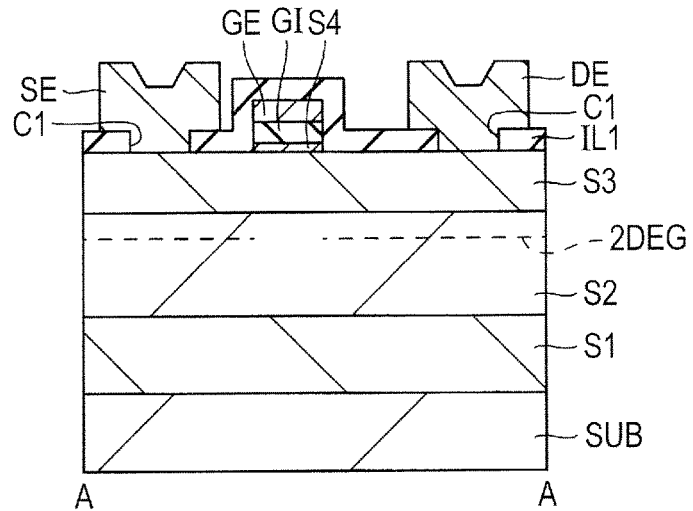
FIG. 32 is a cross section illustrating a process of manufacturing the semiconductor device of the first embodiment.
Figure 33:
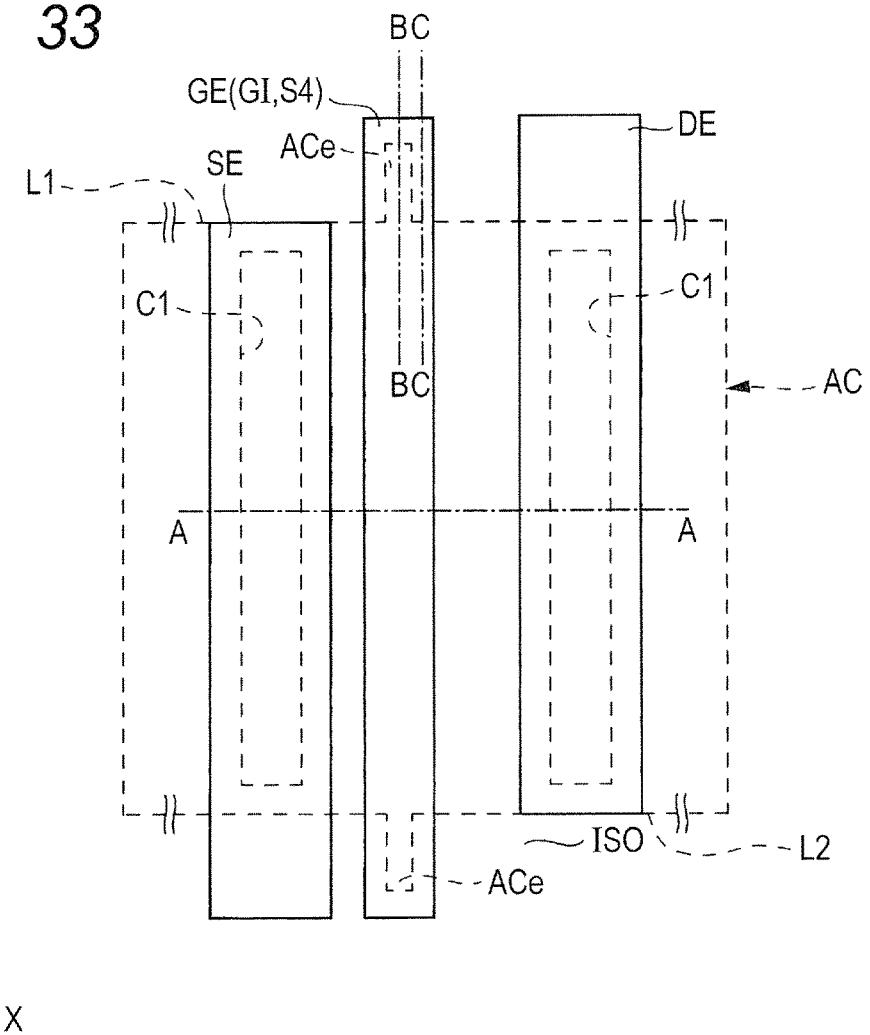
FIG. 33 is a plan view illustrating a process of manufacturing the semiconductor device of the first embodiment.
Figure 34:
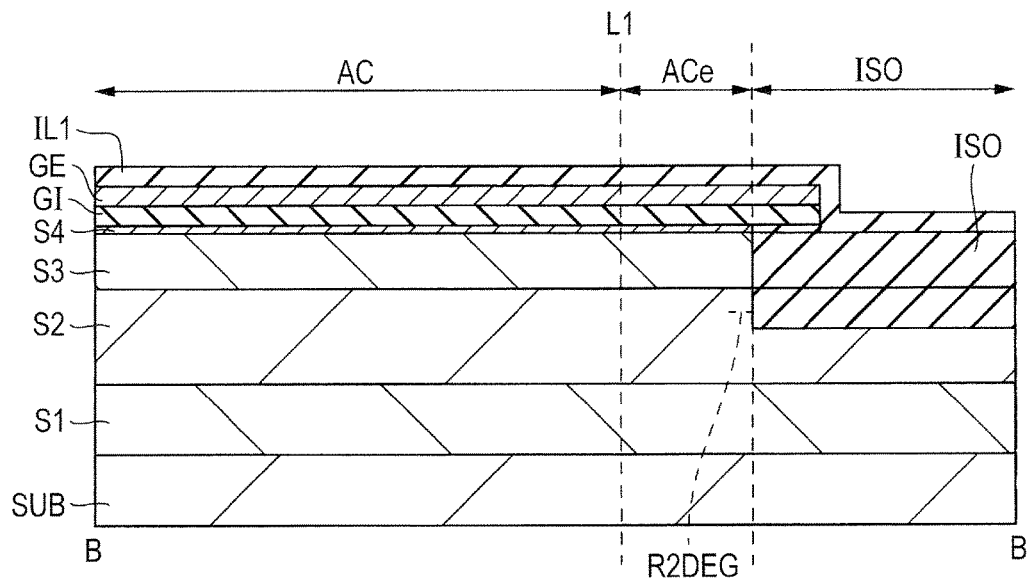
FIG. 34 is a cross section illustrating a process of manufacturing the semiconductor device of the first embodiment.
Figure 35:
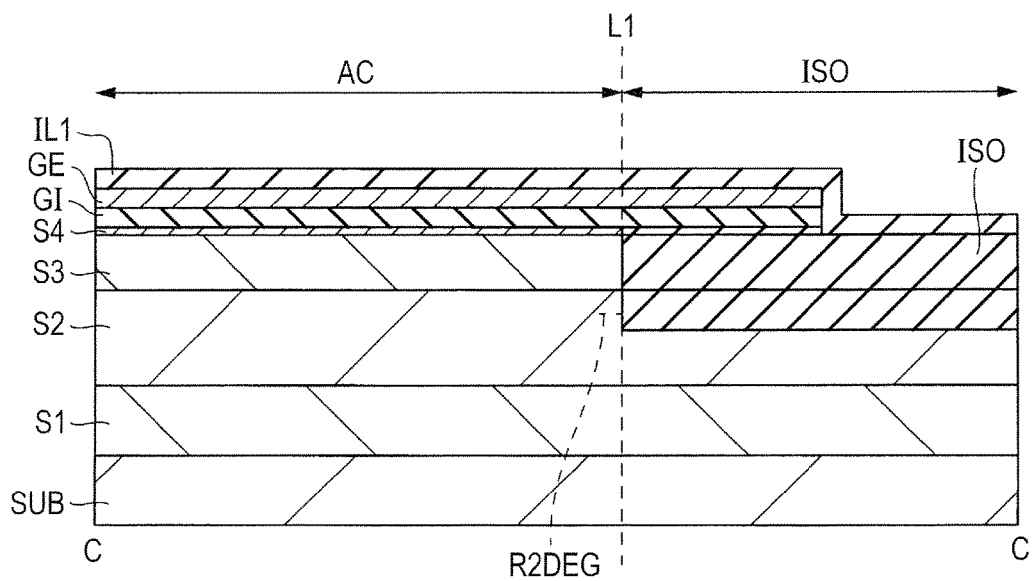
FIG. 35 is a cross section illustrating a process of manufacturing the semiconductor device of the first embodiment.
Figure 36:
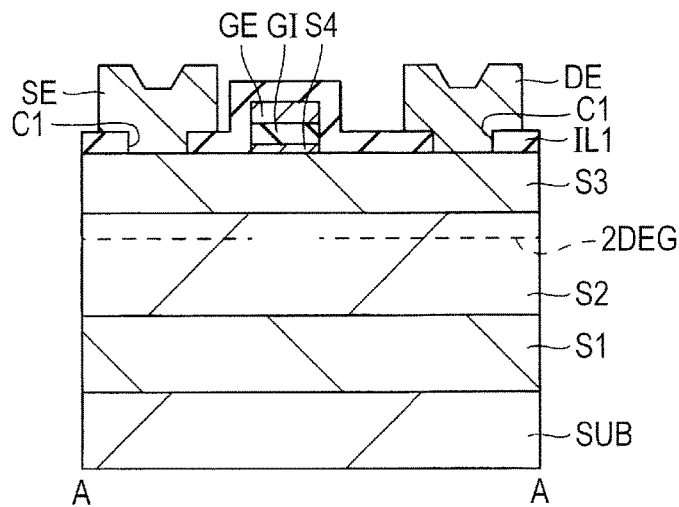
FIG. 36 is across section illustrating a structure of a semiconductor device of a second embodiment.

For example, boron ion is implanted into a part of the stack body made of the first to fourth nitride semiconductor layers S1 to S4 at density of about $1 \times 10^{14}$ (1E14) cm$^{-2}$. The implantation energy is, for example, about 100 keV. The implantation condition of boron ion is adjusted so that the implantation depth, that is, the bottom of the element isolation region ISO is positioned, for example, lower than the bottom face of the third nitride semiconductor layer (barrier layer) S3. In such a manner, the element isolation region ISO is formed. The region surrounded by the element isolation region ISO becomes the active region AC. As illustrated in FIG. 21, the active region AC has the projection part (projection region) ACe. More concretely, the active region AC has an almost rectangular shape and has the projection part ACe projected from the line L1 as the end part. The active region AC also has the projection part ACe projected from the line L2. Over the projection part ACe, the gate electrode GE which will be described later is arranged. By providing the projection parts ACe, the border between the active region AC and the element isolation region ISO becomes longer, the gate electrode GE is arranged over the border and, even when a parasitic transistor is generated by the influence of the above-described residual 2DEG (R2DEG), the channel length increases and turn-on is suppressed. After that, the photoresist film PR1 is removed by plasma stripping process or the like and, further, the protection film IF is removed.

The first to fourth nitride semiconductor layers S1 to S4 are grown while introducing, for example, carrier gas and source gas into a device. As the source gas, a gas containing a constituent element of a nitride semiconductor layer (in this case, the AlGaN layer and the GaN layer) is used. For example, at the time of forming the AlGaN layer, as the source gases of Al, Ga, and N, trimethyl aluminum (TMAl), trimethyl gallium (TMG), and ammonia are used, respectively. For example, at the time of forming the GaN layer, trimethyl gallium (TMG) and ammonia are used as the source gases of Ga and N, respectively. As described above, according to the epitaxial growing method, by adjusting the flow rate of the source gas, the constituent element ratio of each layer can be adjusted easily and precisely. According to the epitaxial growing method, by switching the source gases, layers of different element constitutions can be formed easily successively.

Subsequently, as illustrated in FIGS. 24 to 27, over the fourth nitride semiconductor layer S4, an insulating film 10 which becomes a gate insulating film GI and a conductive film 11 which becomes a gate electrode GE are sequentially formed. For example, over the fourth nitride semiconductor layer (cap layer) S4, as the insulating film 10 for the gate insulating film GI, an aluminum oxide film ($Al_2O_3$ film) is deposited with a thickness of about 50 nm by using the ALD method or the like. As the insulating film 10 for the gate insulating film GI, except for the aluminum oxide film, a silicon oxide film or a high-dielectric-constant film whose dielectric constant is higher than that of a silicon oxide film may be used. As the high-dielectric-constant film, a hafnium insulating film such as SiN film, SiON film (silicon oxynitride film), ZrO2 film (zirconium oxide film), HfO2 film (hafnium oxide film, hafnium aluminate film, HfON film (hafnium oxynitride film), HfSiO film (hafnium silicate film), HfSiON film (hafnium silicon oxynitride film), or HfAlO film may be used.

After that, for example, over the insulating film 10 for the gate insulating film GI, as the conductive film 11 for the gate electrode GE, for example, a TiN (titanium nitride) film is deposited at a thickness of about 200 nm by using the sputtering method or the like. The material and the thickness of the conductive film 11 can be properly adjusted. As the conductive film 11 for the gate electrode GE, polycrystal silicon to which a dopant such as B or P except for TiN is added can be also used. Ti, Al, Ni, Pt, Au, or an Si compound or an N compound of any of them may be also used. A multilayer film obtained by stacking films of those materials may be used.

As illustrated in FIGS. 28 to 31, by using the photolithography technique, a photoresist film PR2 is formed in the gate electrode formation region, and the TiN film is etched by using the photoresist film PR2 as a mask, thereby forming the gate electrode GE. Etching a film in a lower layer using a film in a desired shape as a mask as described above is called patterning. Concretely, for example, by dry etching using gas whose main component is $Cl_2$, the TiN film is etched. In place of chlorine gas such as $Cl_2$, fluorine gas may be used. Mixture gas of chlorine gas and fluorine gas may be used. Subsequently, the aluminum oxide film as a lower layer of the gate electrode (TiN film) GE is etched. For example, by dry etching using gas whose main component is $BCl_3$, the aluminum oxide film is etched. Subsequently, the fourth nitride semiconductor layer (cap layer) S4 as a lower layer of the gate insulating film (aluminum oxide film) GI is etched. For example, by dry etching using chlorine gas, the fourth nitride semiconductor layer S4 is processed. By the operation, a stack body of the mesa-shaped fourth nitride semiconductor layer S4, the gate insulating film GI, and the gate electrode GE is formed.

At this stage, the mesa-shaped fourth nitride semiconductor layer S4 is formed partly (for example, in a rectangular shape having long sides in the Y direction) on the third nitride semiconductor layer (barrier layer) S3. On the other hand, the fourth nitride semiconductor layer S4 is removed in the exposure part in the third nitride semiconductor layer S3 on both sides of the mesa-shaped fourth nitride semiconductor layer S4, so that 2DEG is generated again.

After that, the photoresist film PR2 is removed. It is also possible to remove the photoresist film PR2 after process of the gate electrode GE and, using the gate electrode GE as a mask, etch the gate insulating film GI and the fourth nitride semiconductor layer S4.

As illustrated in FIGS. 32 to 35, the interlayer insulating film IL1 is formed over the gate electrode GE. For example, a silicon oxide film is deposited about 2 μm by using the CVD method or the like as the interlayer insulating film IL1. As the silicon oxide film, a so-called TEOS film also using tetraethyl orthosilicate as a material may be used. Subsequently, the contact hole C1 is formed in the interlayer insulating film IL1 by using photolithography and etching technique. For example, over the interlayer insulating film IL1, a photoresist film (not illustrated) having openings in a source electrode coupling region and a drain electrode coupling region is formed. Subsequently, by etching the interlayer insulating film IL1 using the photoresist film as a mask, the contact hole C1 is formed. For example, the interlayer insulating film IL1 is etched by dry etching using a gas whose main component is $SF_6$. By the operation, the third nitride semiconductor layer (barrier layer) S3 in the source electrode coupling region and the drain electrode coupling region positioned on both sides of the gate electrode GE is exposed.

After that, in the contact hole C1 and over the interlayer insulating film IL1, the source electrode SE and the drain electrode DE are formed. For example, a conductive film is formed over the interlayer insulating film IL1 including the inside of the contact hole C1. For example, an Al/Ti film is formed as the conductive film. For example, a Ti film is formed at a thickness of about 20 nm by using the sputtering method over the interlayer insulating film IL1 including the inside of the contact hole and, further, an Al film is formed at a thickness of about 2 μm by using the sputtering method over the Ti film. Then, heat treatment is performed. For example, heat treatment is performed at 500° C. for 30 minutes. By the treatment, ohmic contact can be made between the conductive film (Al/Ti film) and its lower layer.

Subsequently, a photoresist film (not illustrated) is formed in the formation regions of the source electrode SE and the drain electrode DE and, using the photoresist film (not illustrated) as a mask, the conductive film (Al/Ti film) is etched. For example, by dry etching using a gas whose main component is $Cl_2$, the conductive film (Al/Ti film) is etched.

The constitution material and thickness of the conductive film constructing the source electrode SE and the drain electrode DE can be properly adjusted. It is preferable to use, as such a conductive film, a material which is ohmic-contacted to the nitride semiconductor layer.

After that, an insulating film may be formed over the interlayer insulating film IL1 including the source electrode SE and the drain electrode DE and, further, a wire line in an upper layer may be formed. Over a wire line in an uppermost layer, a protection film made by an insulating film may be formed.

By the above process, the semiconductor device of the embodiment can be formed. The process is an example and the semiconductor device of the embodiment may be formed by a process other than the above-described process.

Second Embodiment

Although the element isolation region ISO is assumed as a high-resistive region in which crystalline nature is destroyed in the nitride semiconductor layer in the first embodiment, the element isolation region ISO may be assumed as a region from which the nitride semiconductor layer is removed.

Description of Structure

Figure 37:
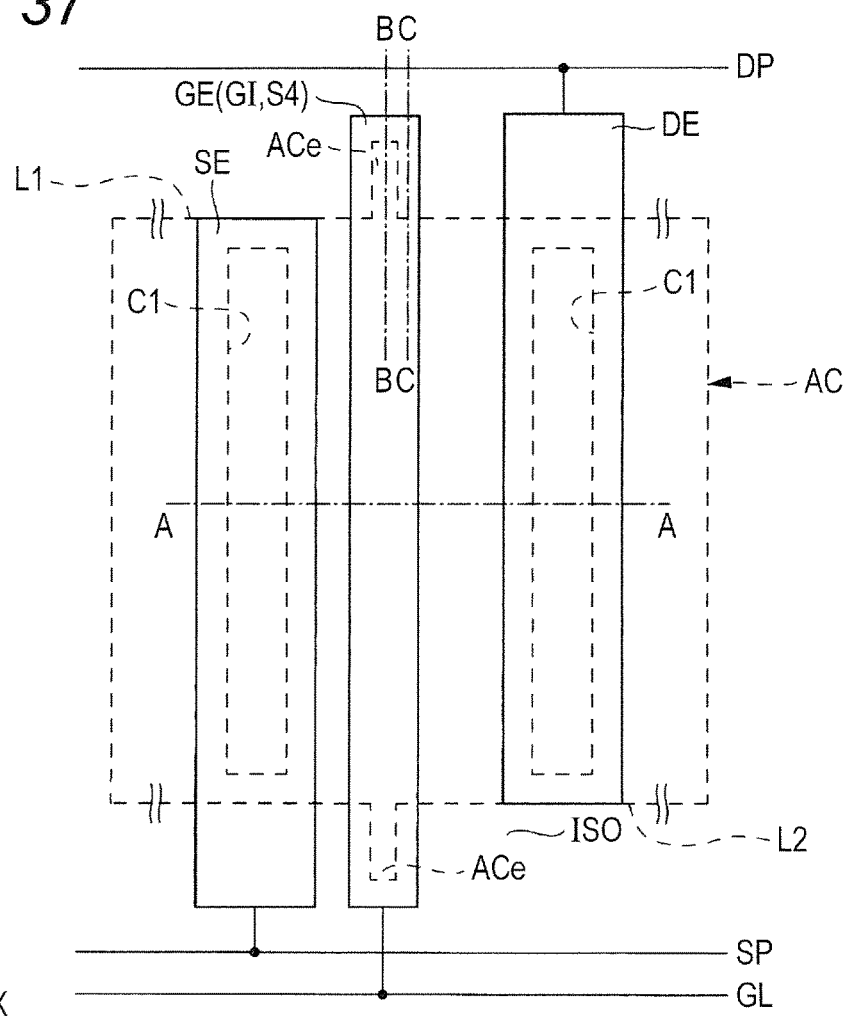
FIG. 37 is a plan view illustrating the structure of the semiconductor device of the second embodiment.

FIGS. 36 to 39 are cross sections and plan view illustrating the structure of a semiconductor device of a second embodiment. FIG. 37 is a plan view, FIG. 36 corresponds to the A-A section in FIG. 37, FIG. 38 corresponds to the B-B section in FIG. 37, and FIG. 39 corresponds to the C-C section in FIG. 37.

As illustrated in FIGS. 36 to 39, the structure other than the element isolation region ISO is similar to that of the semiconductor device of the first embodiment (FIG. 1), so that its description will not be repeated.

Figure 38:
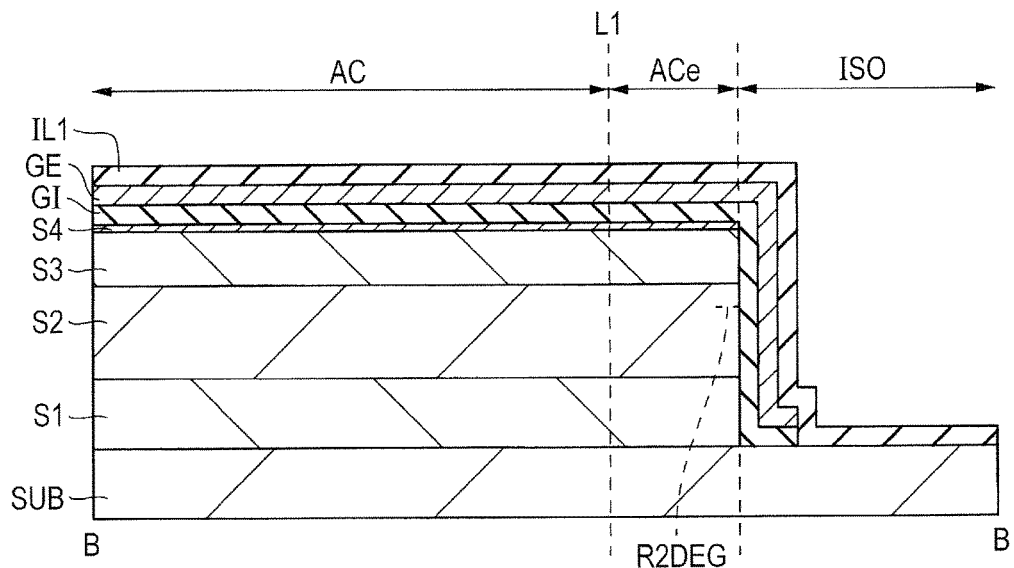
FIG. 38 is a cross section illustrating the structure of the semiconductor device of the second embodiment.
Figure 39:
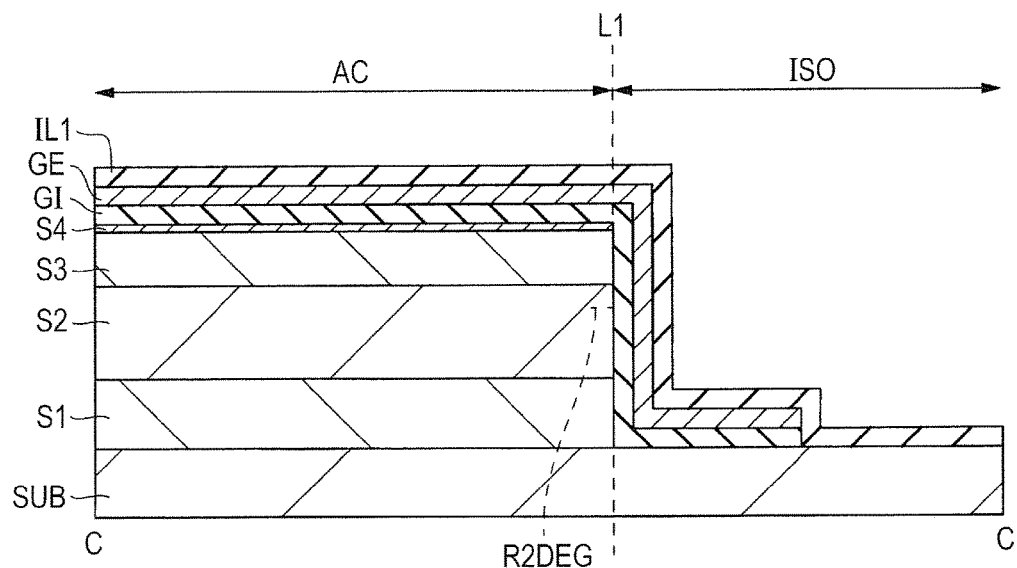
FIG. 39 is a cross section illustrating the structure of the semiconductor device of the second embodiment.
Figure 40:
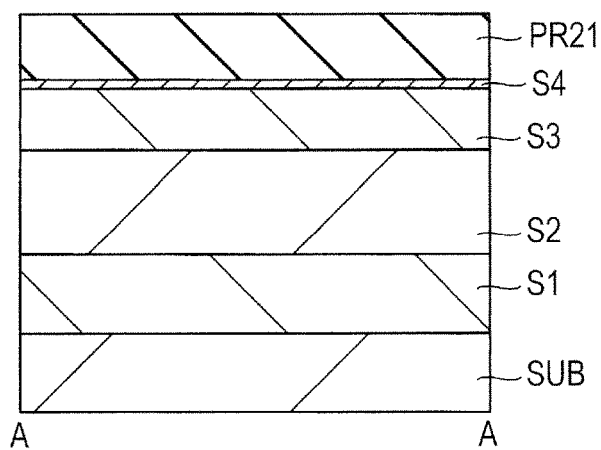
FIG. 40 is a cross section illustrating a process of manufacturing the semiconductor device of the second embodiment.
Figure 41:
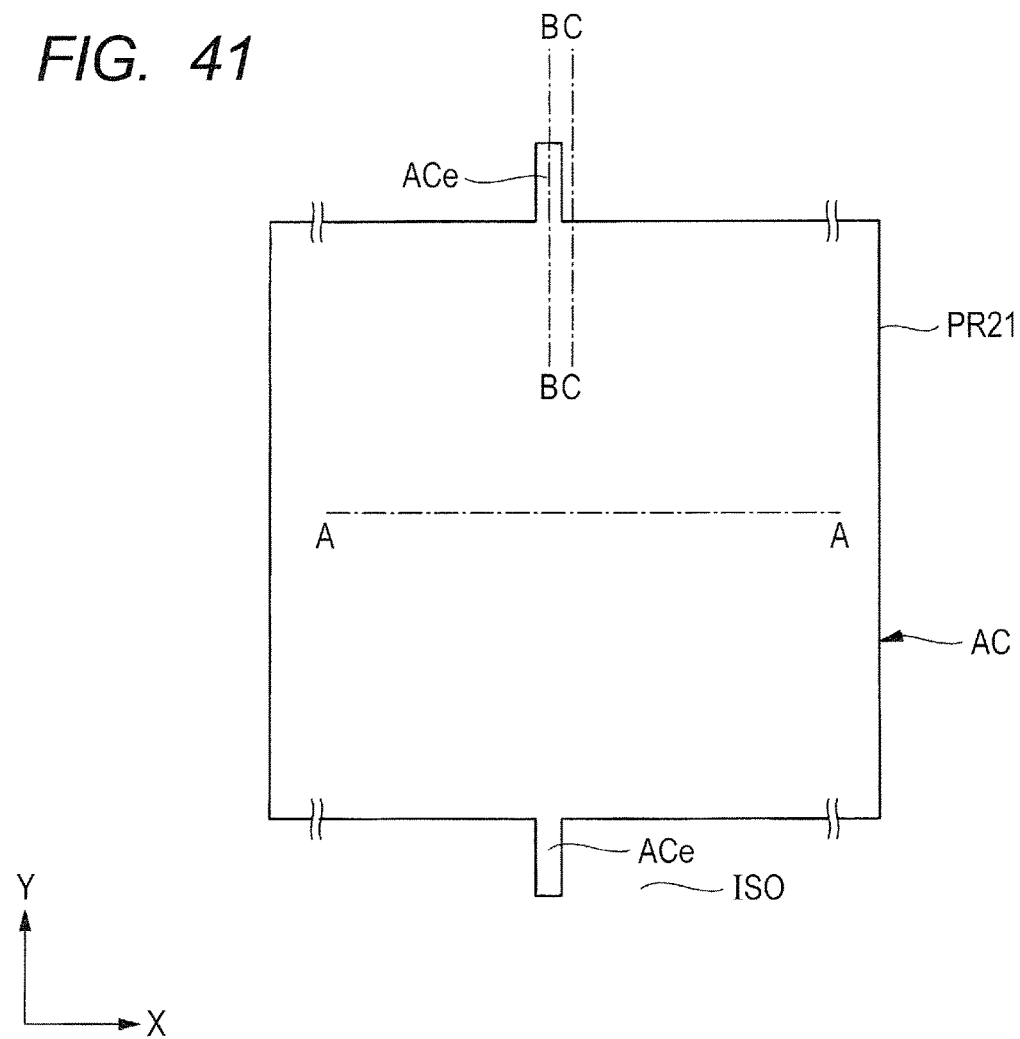
FIG. 41 is a plan view illustrating a process of manufacturing the semiconductor device of the second embodiment.
Figure 42:
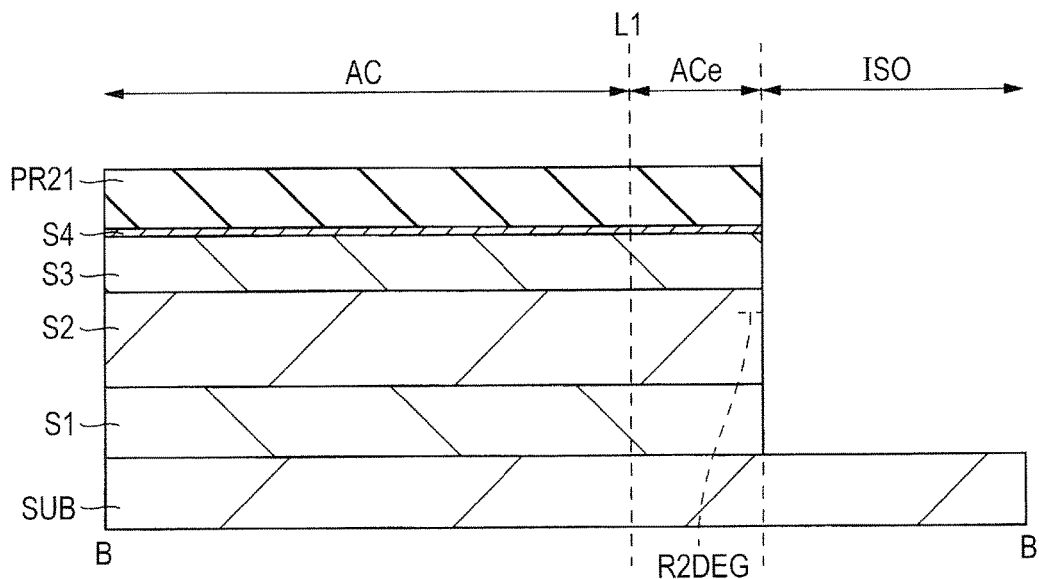
FIG. 42 is a cross section illustrating a process of manufacturing the semiconductor device of the second embodiment.
Figure 43:
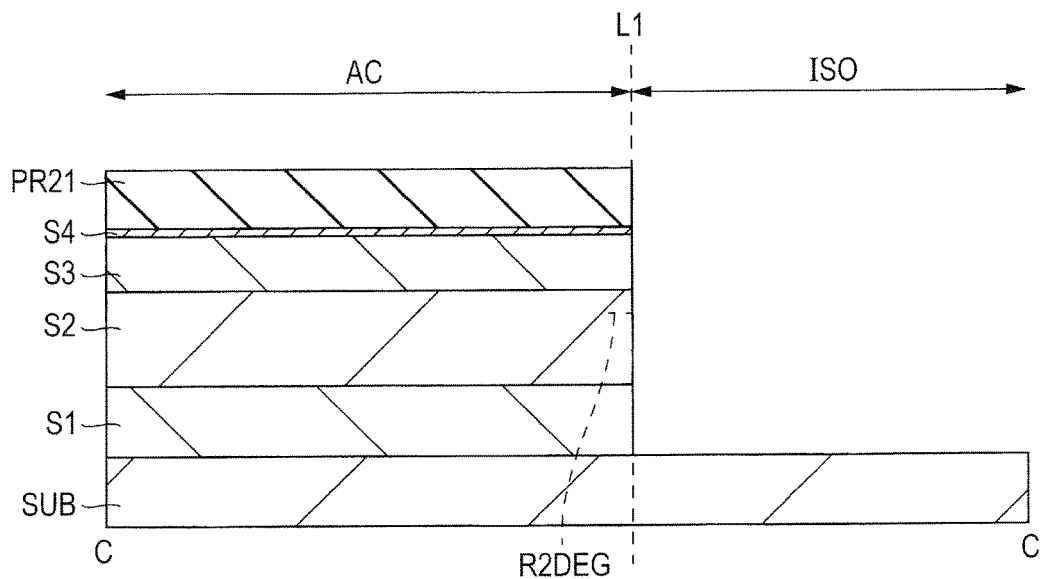
FIG. 43 is a cross section illustrating a process of manufacturing the semiconductor device of the second embodiment.
Figure 44:
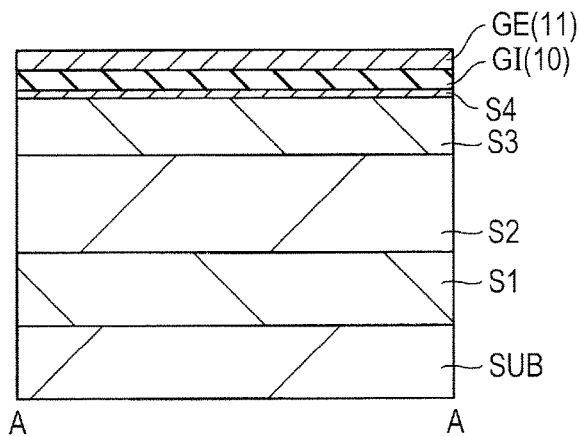
FIG. 44 is a cross section illustrating a process of manufacturing the semiconductor device of the second embodiment.
Figure 45:
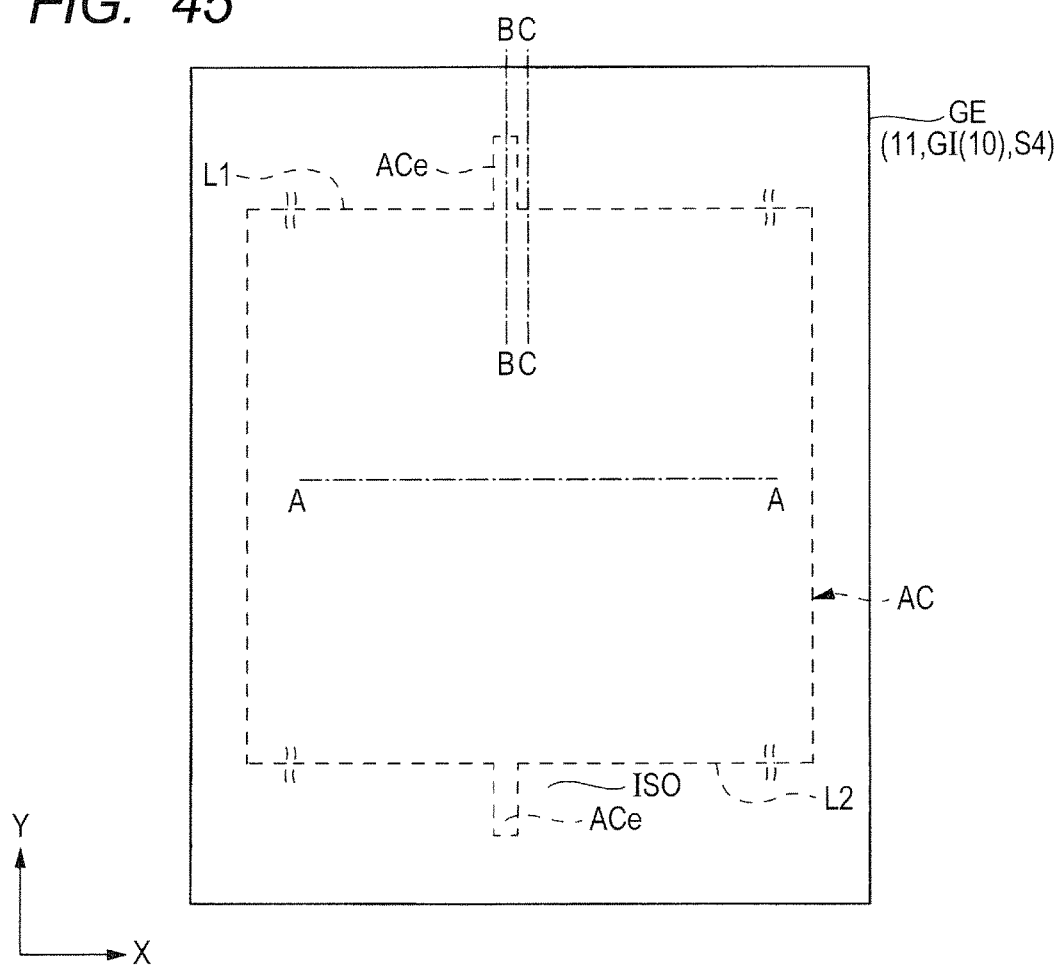
FIG. 45 is a plan view illustrating a process of manufacturing the semiconductor device of the second embodiment.
Figure 46:
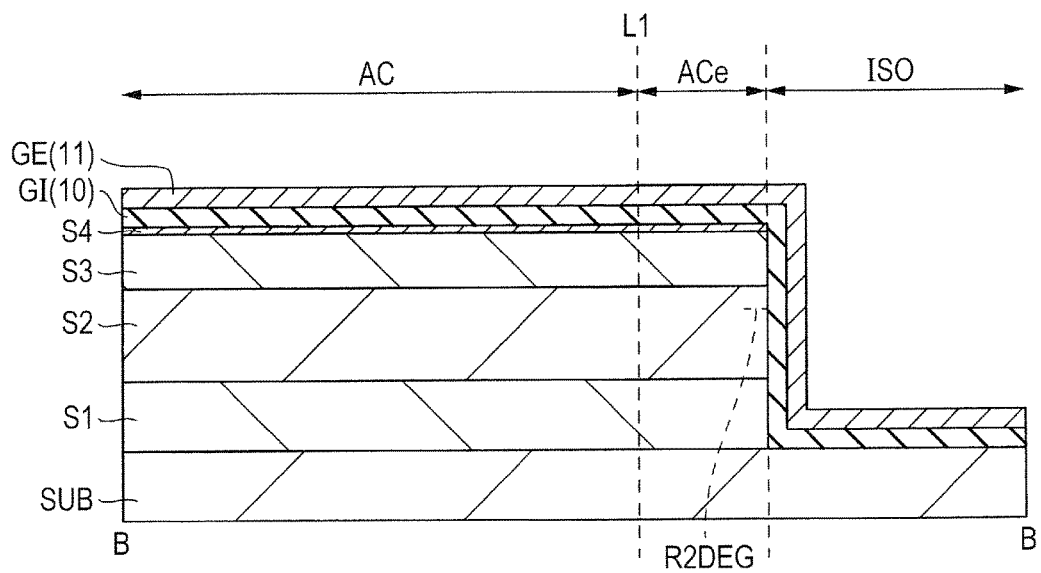
FIG. 46 is a cross section illustrating a process of manufacturing the semiconductor device of the second embodiment.
Figure 47:
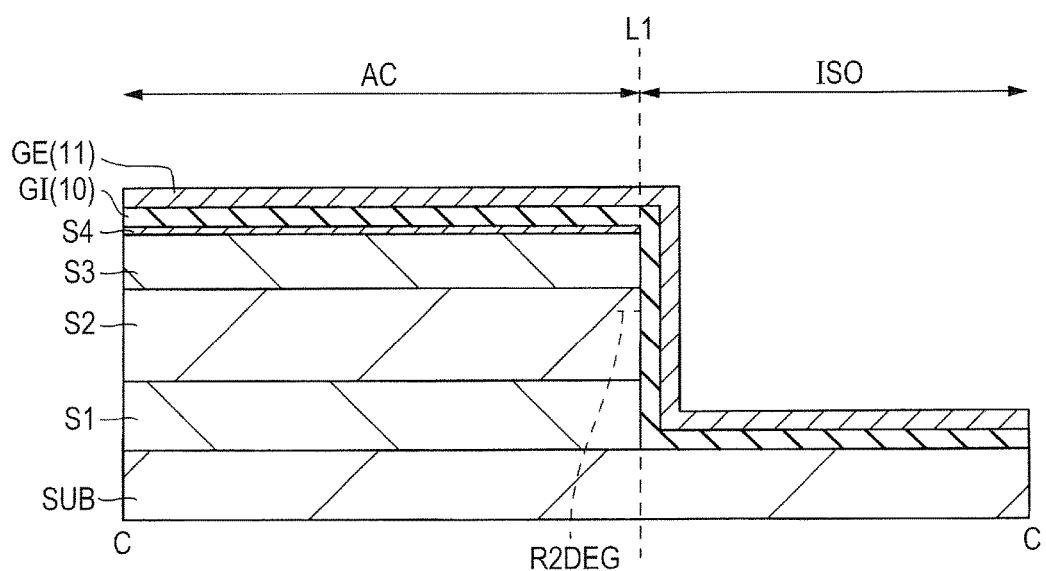
FIG. 47 is a cross section illustrating a process of manufacturing the semiconductor device of the second embodiment.
Figure 48:
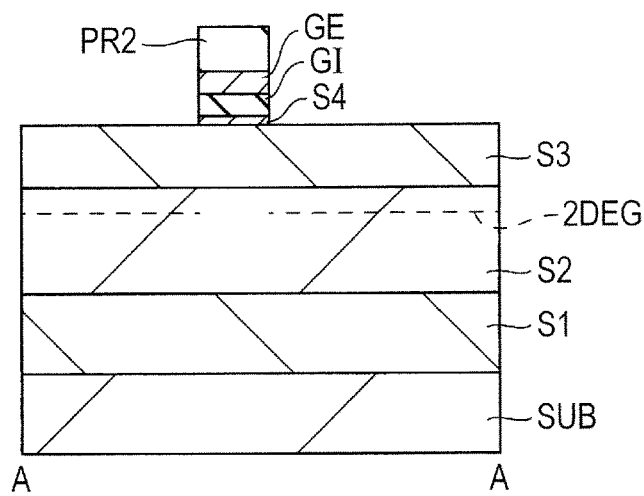
FIG. 48 is a cross section illustrating a process of manufacturing the semiconductor device of the second embodiment.
Figure 49:
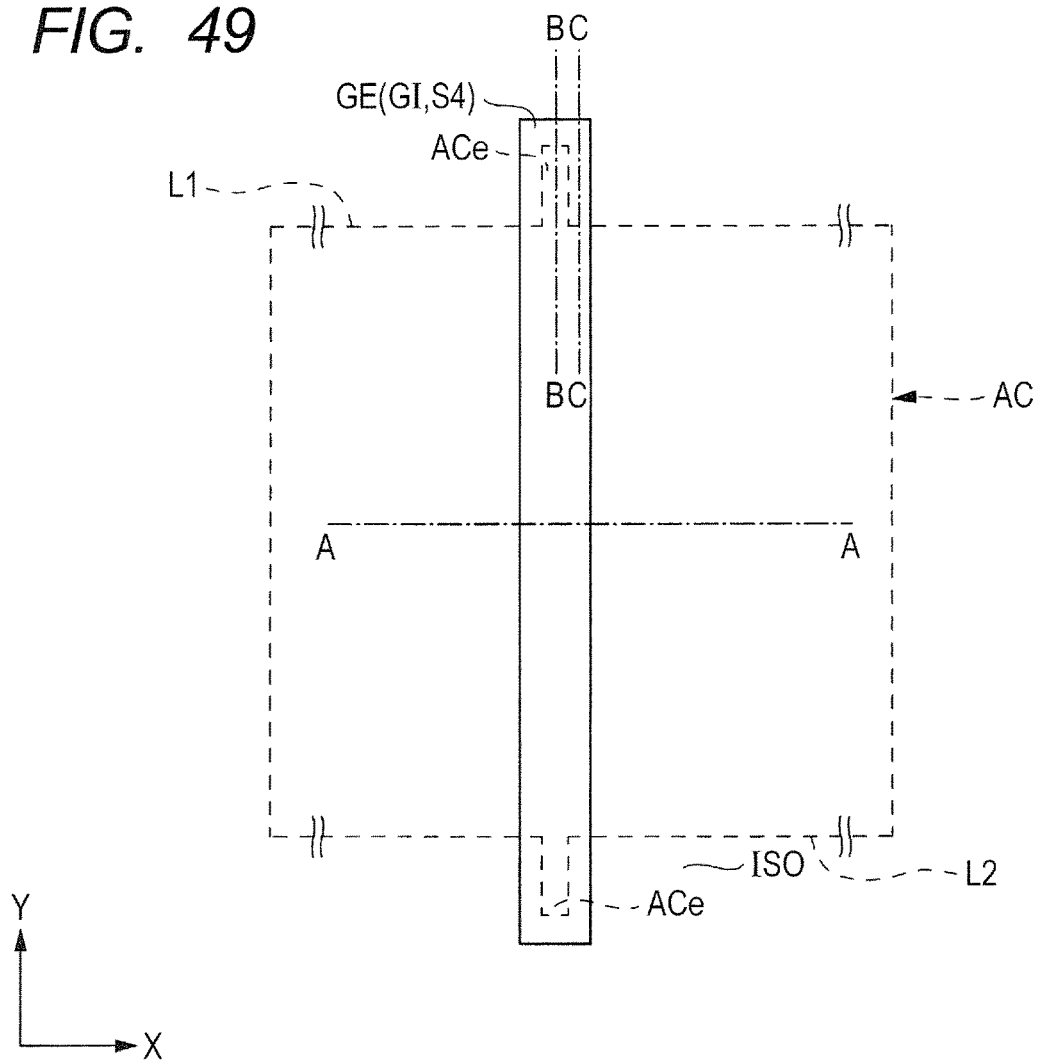
FIG. 49 is a plan view illustrating a process of manufacturing the semiconductor device of the second embodiment.
Figure 50:
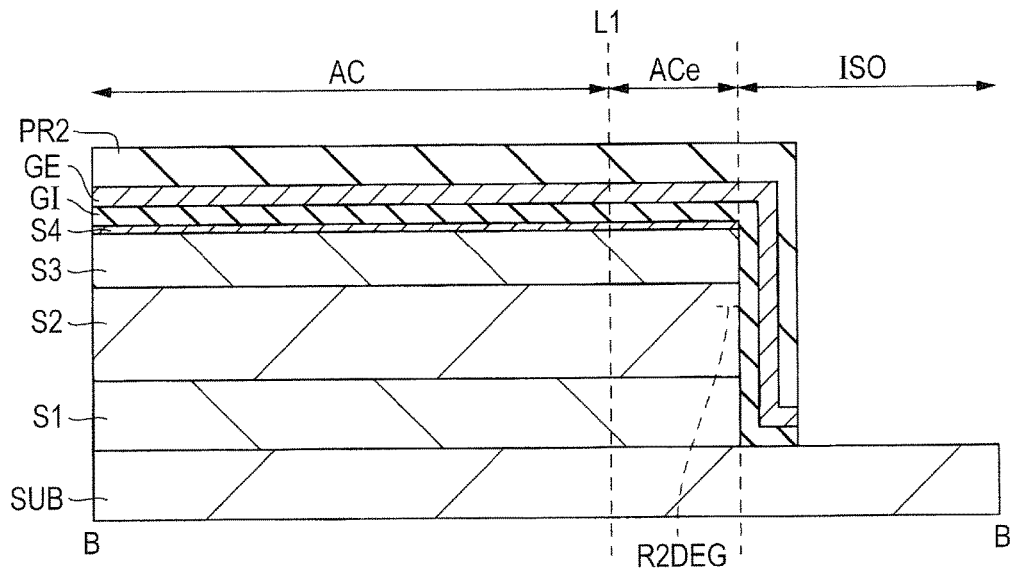
FIG. 50 is a cross section illustrating a process of manufacturing the semiconductor device of the second embodiment.
Figure 51:
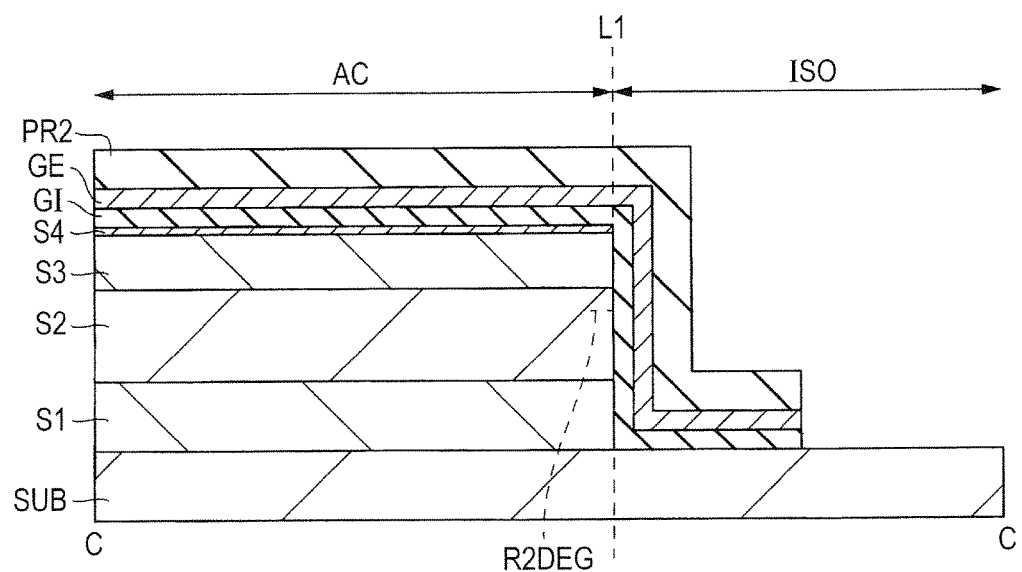
FIG. 51 is a cross section illustrating a process of manufacturing the semiconductor device of the second embodiment.
Figure 52:
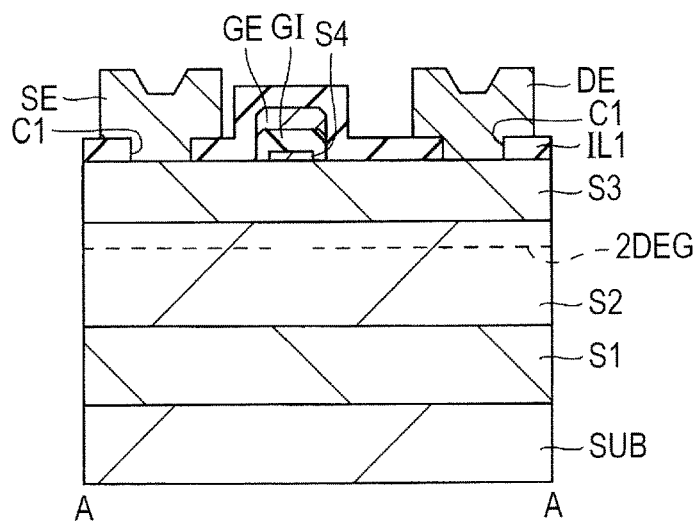
FIG. 52 is across section illustrating a structure of a semiconductor device of a first application example of a third embodiment.

In the second embodiment, in the element isolation region ISO, the first to fourth nitride semiconductor layers (S1 to S4) are removed (FIGS. 38 and 39). By removing the first to fourth nitride semiconductor layers (S1 to S4) as described above, the active region AC is defined and can be electrically isolated from the other active regions and the like. Although all of the stack body of the first to fourth nitride semiconductor layers (S1 to S4) is removed in the element isolation region ISO, it is sufficient to remove the stack body at least to the region in which 2DEG is generated.

Also in the transistor of the embodiment, in a manner similar to the case of the first embodiment, the active region AC as the transistor formation region is provided with the projection part ACe projected in the direction of the element isolation region ISO in a region overlapped with the gate electrode GE in plan view. Consequently, threshold potential can be improved, and the normally off characteristic can be stably maintained.

Description of Manufacturing Method

Subsequently, with reference to FIGS. 40 to 51, a method of manufacturing a semiconductor device of the second embodiment will be described, and the structure of the semiconductor device will be more clarified. FIGS. 40 to 51 are cross sections and plan views illustrating processes of manufacturing the semiconductor device of the embodiment.

In a manner similar to the first embodiment, the substrate SUB is prepared, and the first to fourth nitride semiconductor layers (S1 to S4) are sequentially formed (FIGS. 40 to 43).

Subsequently, by the photolithography technique, a photoresist film PR21 which opens an element isolation region is formed over the fourth nitride semiconductor layer (cap layer) S4. Using the photoresist film PR21, the first to fourth nitride semiconductor layers S1 to S4 are etched. A removed region (trench) in the first to fourth nitride semiconductor layers S1 to S4 becomes the element isolation region ISO. The region surrounded by the element isolation region ISO becomes the active region AC. The active region AC has a shape similar to that in the case of the first embodiment and has the projection part (projection region) ACe. By providing the projection parts ACe, the border between the active region AC and the element isolation region ISO becomes longer, the gate electrode GE is arranged over the border and, even when a parasitic transistor is generated by the influence of the above-described residual 2DEG (R2DEG), the channel length is long and turn-on is suppressed.

After that, the photoresist film PR21 is removed by plasma stripping process or the like.

Subsequently, as illustrated in FIGS. 44 to 47, over the fourth nitride semiconductor layer S4 and the substrate SUB, the insulating film 10 which becomes the gate insulating film GI and the conductive film 11 which becomes the gate electrode GE are sequentially formed. The insulating film 10 which becomes the gate insulating film GI and the conductive film 11 which becomes the gate electrode GE can be formed by using materials similar to those in the case of the first embodiment and in a manner similar to the first embodiment.

As illustrated in FIGS. 48 to 51, by using the photolithography technique, the photoresist film PR2 is formed in the gate electrode formation region, and the conductive film 11 which becomes the gate electrode GE, the insulating film 10 which becomes the gate insulating film GI, and the fourth nitride semiconductor layer (cap layer) S4 are etched by using the photoresist film PR2 as a mask. After that, the photoresist film PR2 is removed.

After that, in a manner similar to the case of the first embodiment, the interlayer insulating film IL1 is formed over the gate electrode GE and etched, thereby forming the contact hole C1. Further, the source electrode SE and the drain electrode DE are formed on the inside of the contact hole C1 and over the interlayer insulating film IL1 (FIGS. 36 to 39).

After that, an insulating film may be formed over the interlayer insulating film IL1 including the source electrode SE and the drain electrode DE and, further, a wire line in an upper layer may be also formed. Over a wire line in the uppermost layer, a protection film made by an insulating film may be formed.

By the above process, the semiconductor device of the second embodiment can be formed. The above process is an example and the semiconductor device of the embodiment can be manufactured also by a process other than the above process.

Third Embodiment

In a third embodiment, various application examples will be described. Although the gate electrode GE and the mesa-shaped fourth nitride semiconductor layer (cap layer) S4 have similar shapes in the first embodiment, the size of the mesa-shaped fourth nitride semiconductor layer (cap layer) S4 may be smaller than that of the gate electrode GE (application example 1). The source electrode SE may extend over the gate electrode GE (application example 2).

Application Example 1

Figure 53:
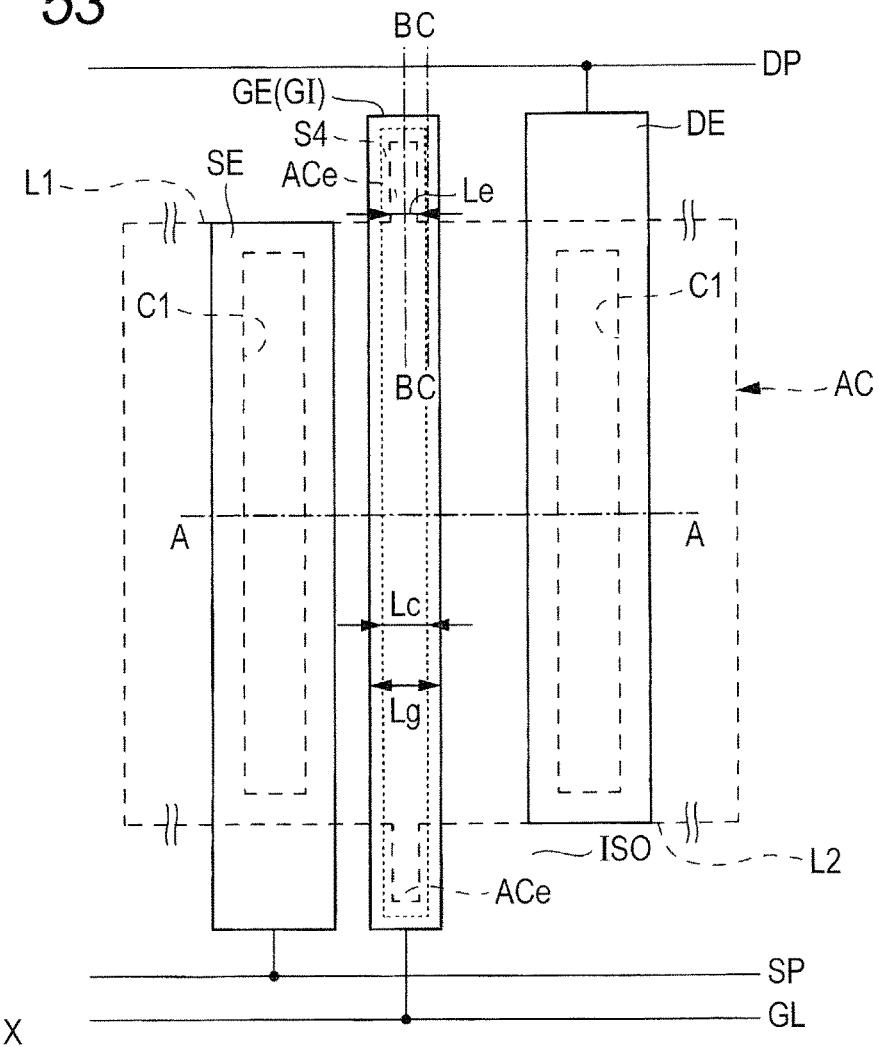
FIG. 53 is a plan view illustrating a structure of the semiconductor device of the first application example of the third embodiment.
Figure 54:
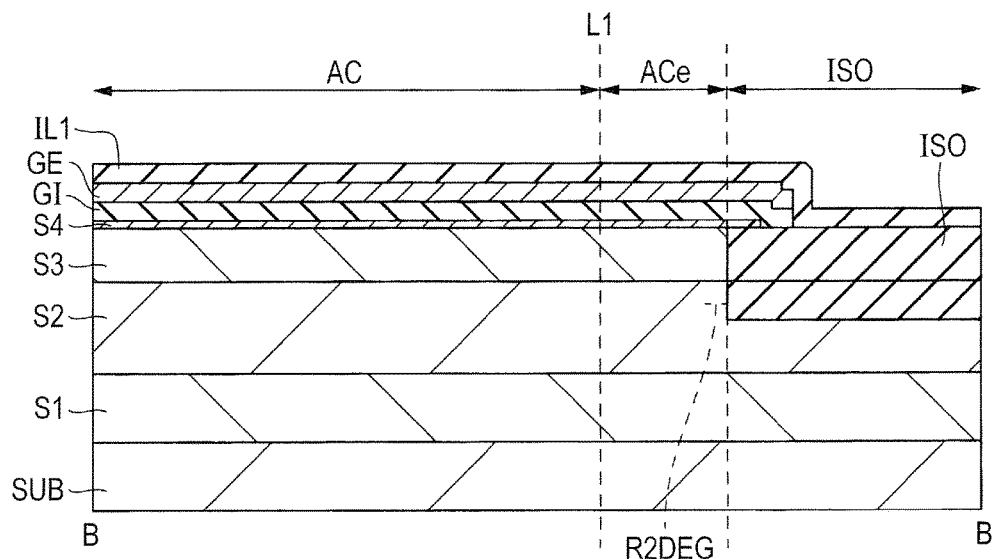
FIG. 54 is a cross section illustrating a structure of the semiconductor device of the first application example of the third embodiment.
Figure 55:
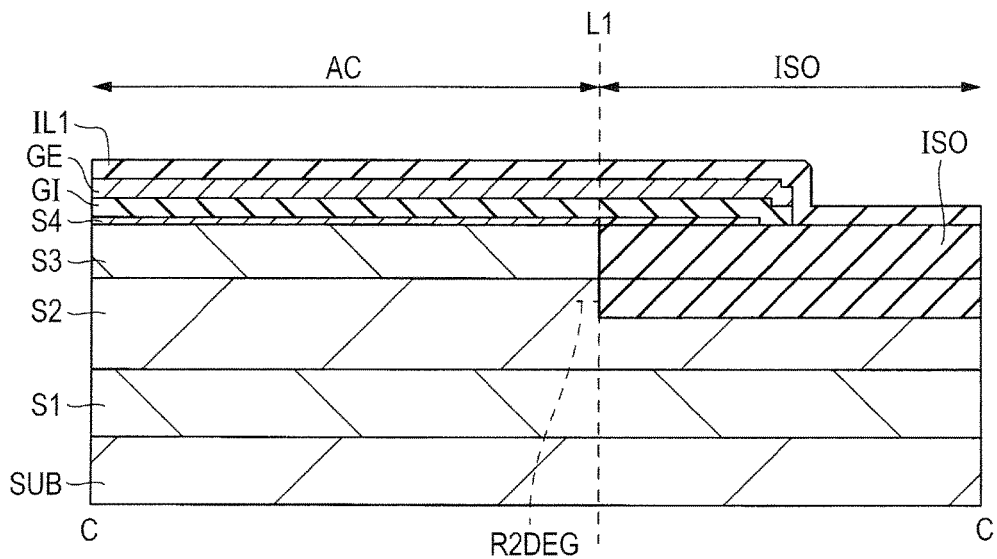
FIG. 55 is a cross section illustrating a structure of the semiconductor device of the first application example of the third embodiment.

FIGS. 52 to 55 are cross sections and plan view illustrating the structure of a semiconductor device of the first application example of the third embodiment. FIG. 53 is a plan view, FIG. 52 corresponds to the A-A section in FIG. 53, FIG. 54 corresponds to the B-B section in FIG. 53, and FIG. 55 corresponds to the C-C section in FIG. 53.

As illustrated in FIGS. 52 to 55, the structure except the mesa-shaped fourth nitride semiconductor layer (cap layer) S4 is similar to that in the semiconductor device of the first embodiment (FIG. 1), so that the description will not be repeated.

In the embodiment, the size of the mesa-shaped fourth nitride semiconductor layer (cap layer) S4 is smaller than that of the gate electrode GE. Consequently, the mesa-shaped fourth nitride semiconductor layer (cap layer) S4 is included in the stack body of the gate electrode GE and the gate insulating film GI. In this case, the length Le in the X direction of the projection part ACe is smaller than the length Lc in the X direction of the mesa-shaped fourth nitride semiconductor layer (cap layer) S4 (Lg>Lc>Le).

The stack part of the mesa-shaped fourth nitride semiconductor layer (cap layer) S4, the gate insulating film GI, and the gate electrode GE in the application example can be formed as follows.

For example, the fourth nitride semiconductor layer S4 in the first to fourth nitride semiconductor layers (S1 to S4) sequentially stacked over the substrate SUB is patterned in a predetermined shape to form the mesa-shaped fourth nitride semiconductor layer (cap layer) S4 and, after that, over it, an insulating film which becomes the gate insulating film GI and a conductive film which becomes the gate electrode GE are sequentially formed, and the insulating film and the conductive film are patterned at once. At this time, the stack body of the insulating film and the conductive film is patterned so as to be larger than the mesa-shaped fourth nitride semiconductor layer (cap layer) S4. In such a manner, the stack part of the mesa-shaped fourth nitride semiconductor layer (cap layer) S4, the gate insulating film GI, and the gate electrode GE can be formed.

Since the process of manufacturing the other parts is similar to that of the case of the first embodiment, the description will not be repeated.

Application Example 2

Figure 56:
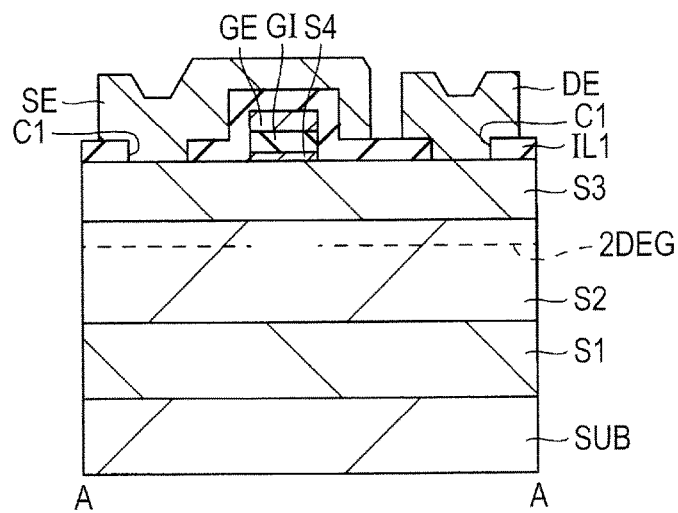
FIG. 56 is across section illustrating a structure of a semiconductor device of a second application example of the third embodiment.
Figure 57:
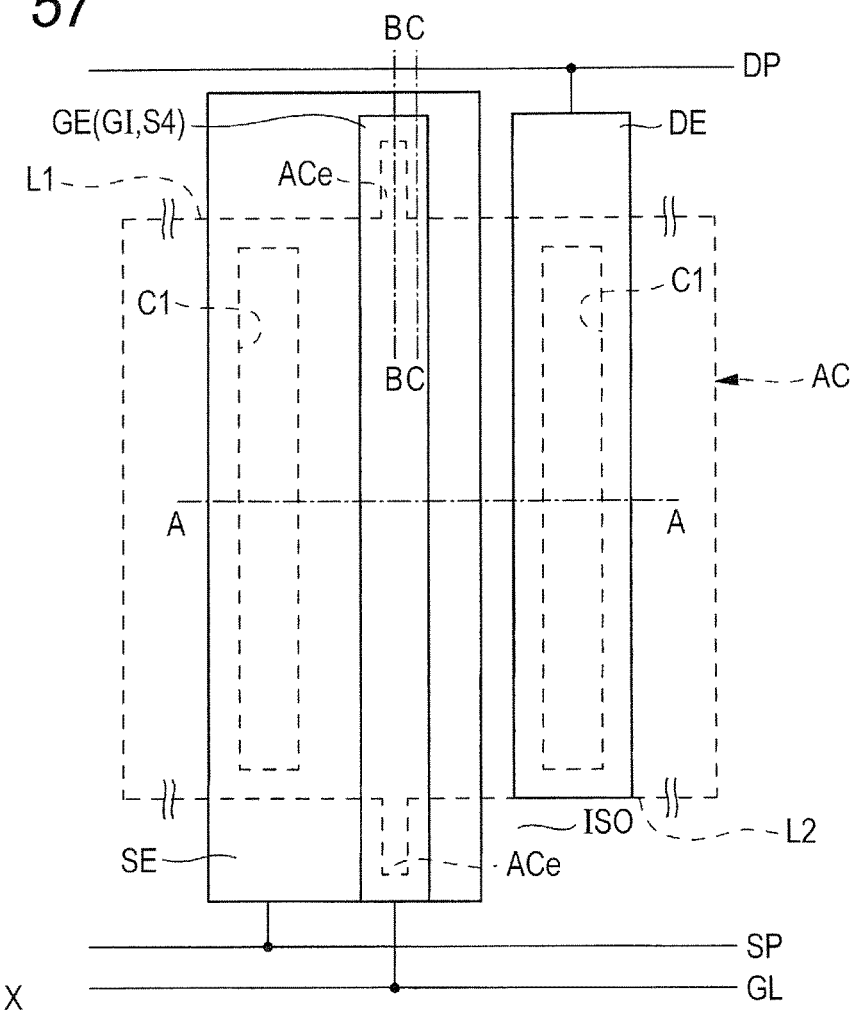
FIG. 57 is a plan view illustrating a structure of the semiconductor device of the second application example of the third embodiment.
Figure 58:
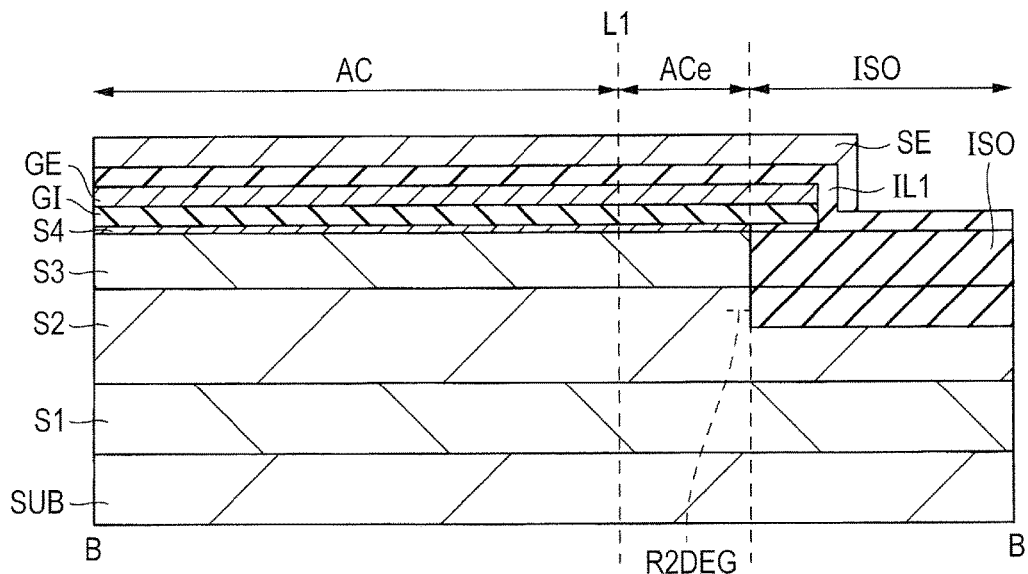
FIG. 58 is a cross section illustrating a structure of the semiconductor device of the second application example of the third embodiment.
Figure 59:
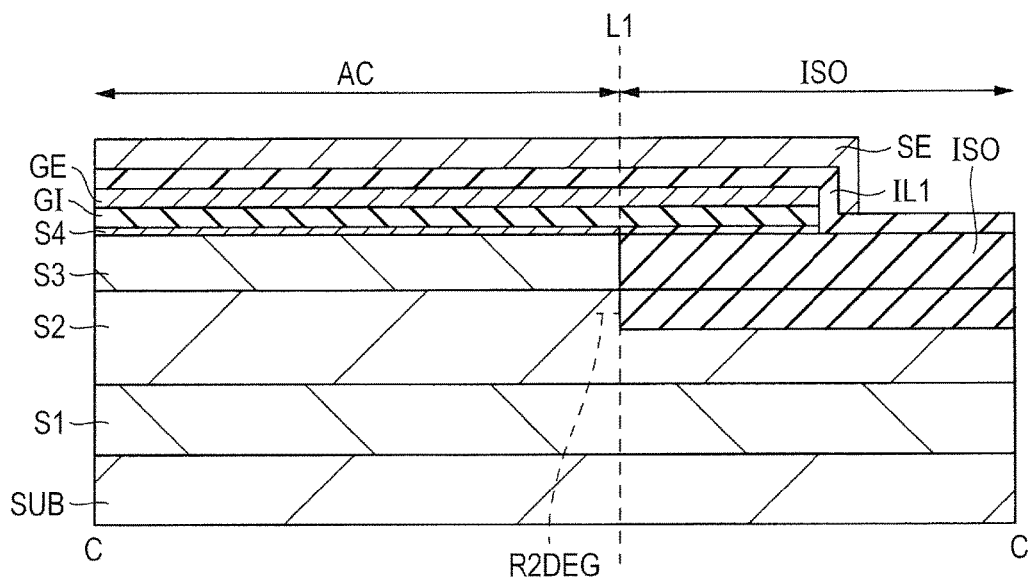
FIG. 59 is a cross section illustrating a structure of the semiconductor device of the second application example of the third embodiment.

FIGS. 56 to 59 are cross sections and plan view illustrating the structure of a semiconductor device of a second application example of the third embodiment. FIG. 57 is a plan view, FIG. 56 corresponds to the A-A section in FIG. 57, FIG. 58 corresponds to the B-B section in FIG. 57, and FIG. 59 corresponds to the C-C section in FIG. 57.

As illustrated in FIGS. 56 to 59, the structure except the source electrode SE is similar to that in the semiconductor device of the first embodiment (FIG. 1), so that the description will not be repeated.

In the embodiment, the source electrode SE is coupled to the third nitride semiconductor layer S3 via the contact hole C1 on one of the sides of the gate electrode GE (the left side in FIG. 56). The source electrode SE extends to the over the gate electrode GE. For example, over the gate electrode GE, the source electrode SE is arranged via the interlayer insulting film IL1. As described above, with a structure that the gate electrode GE is covered by the source electrode, the source field plate effect can be produced.

It is sufficient to pattern the source electrode SE of the application example so that the source electrode SE covers the gate electrode GE at the time of patterning a conductive film (for example, Al/Ti film) for the source electrode SE and the drain electrode DE.

Fourth Embodiment

In a fourth embodiment, the shape of the projection part ACe will be described. FIGS. 60A to 60C and FIG. 61 are plan views for explaining shape examples of the projection part in the embodiment.

Application Example 1

Figures 60A, 60B, 60C:
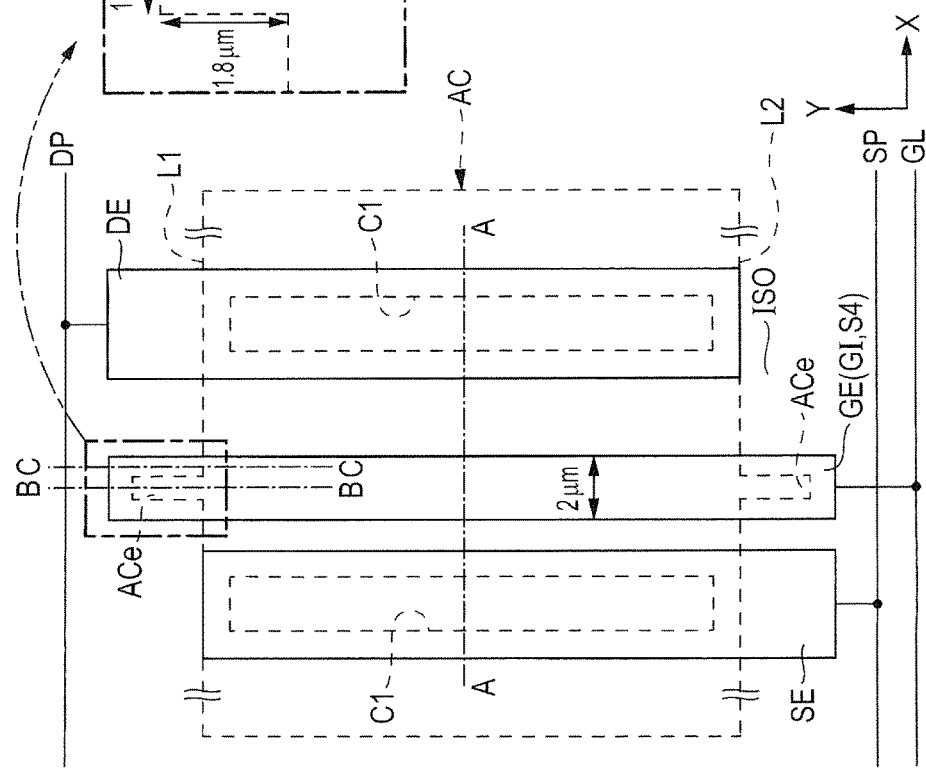
FIGS. 60A to 60C are plan views for explaining a shape example of a projection part in a first application example of a fourth embodiment.

As illustrated in FIG. 60A, the projection part ACe can have a rectangular shape having long sides in the Y direction. This shape example is as described in the first embodiment and the like. The length in the X direction of the projection part ACe is about 1 µm and the length in the Y direction is about 1.8 µm. The length Lg in the X direction of the gate electrode GE is about 2 µm. The projection part ACe is not limited to a rectangular shape but may be a semicircular shape, a semi-ellipse shape, a triangular shape, or the like.

As illustrated in FIG. 60B, the projection part ACe having a plurality of sub projection parts ACes may be provided. Like this example, the border line between the active region AC and the element isolation region ISO may have a plurality of apexes. In FIG. 60B, for example, the length in the X direction of the main projection part ACe is about 1 µm, the length in the Y direction is about 1.5 µm, and the sub projection parts ACes are provided on both sides. For example, the length Lg in the X direction of the sub projection part ACes is about 0.3 µm, and the length in the Y direction is about 0.5 µm. As illustrated in FIG. 60C, a plurality of projection parts ACe may be provided in a region overlapped with the gate electrode GE. For example, the length in the X direction of each of the projection parts ACe is about 0.4 µm, the length in the Y direction is about 1.8 µm, and the length between the projection parts ACe is about 0.4 µm. Those numerical values are an example and the present invention is not limited to the numerical values.

In the shapes illustrated in FIGS. 60B and 60C, the border line between the active region AC and the element isolation region ISO becomes longer, and the channel length of the parasitic transistor can be further increased.

Application Example 2

Figure 61:
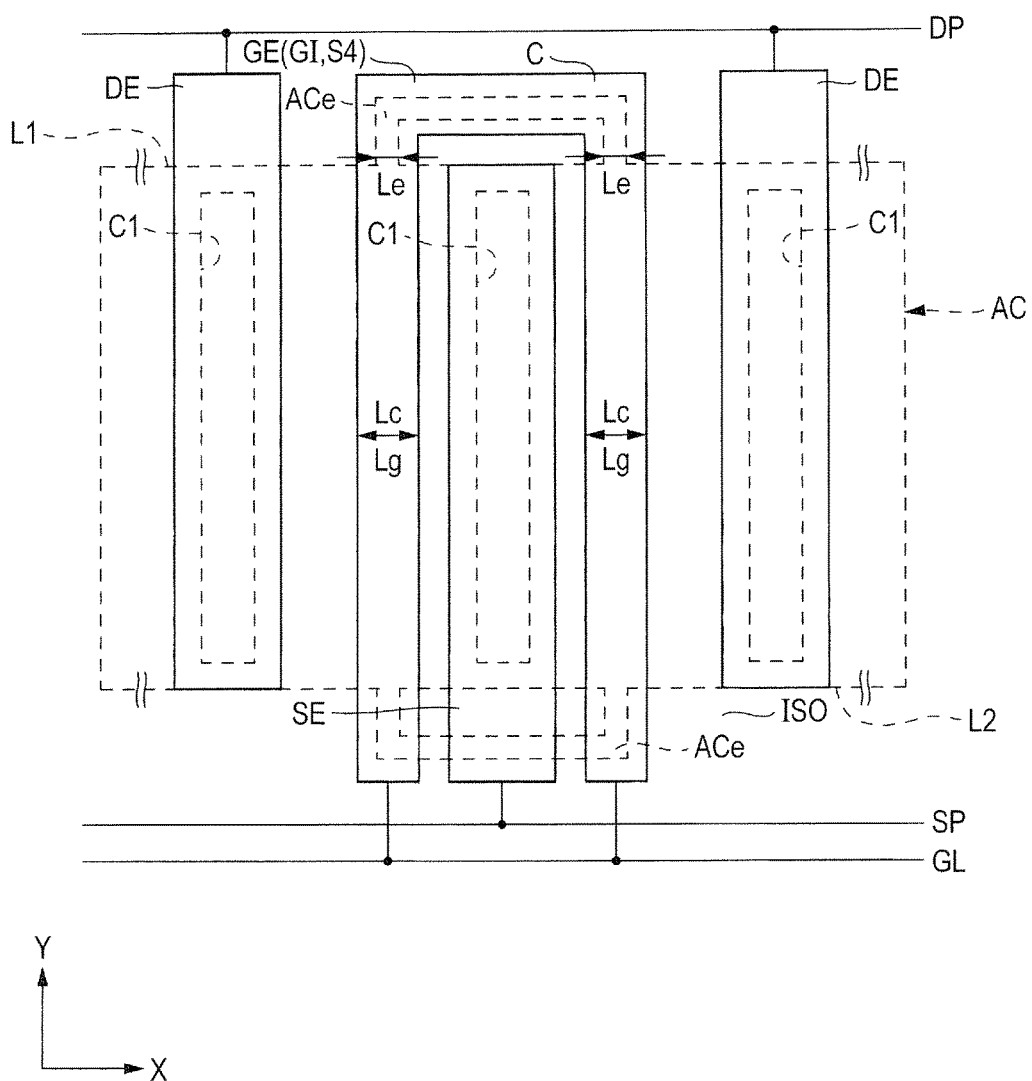
FIG. 61 is a plan view for explaining a shape example of a projection part in a second application example of the fourth embodiment.

As illustrated in FIG. 61, the projection part ACe having a U shape may be provided so as to correspond to a coupling part C while coupling end parts of neighboring two gate electrodes GE (neighboring two mesa-shaped fourth nitride semiconductor layers S4) by the U-shaped coupling part C on the outside of the line L1. In other words, a structure that a first projection part and a second projection part are provided and electrically coupled is also possible. The projection part ACe of the U shape is constructed by the first and second projection parts. Also on the side of the line L2, similarly, the projection part ACe having the U shape may be provided.

In this case, the border line on one of the drain sides of one gate electrode GE is coupled to the border line on the other drain side of the other gate electrode GE. The border line on the source side of one of the gate electrodes GE is coupled to the border line on the source side of the other gate electrode GE.

Figure 62A:
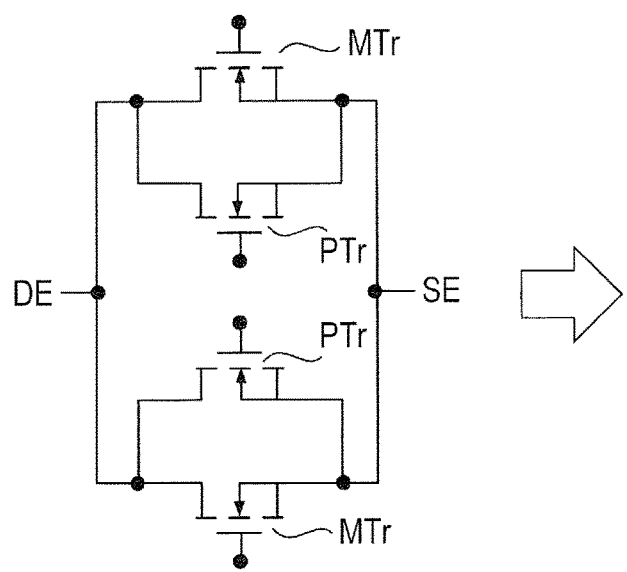
FIGS. 62A and 62B are circuit diagrams for explaining a circuit structure of the second application example of the fourth embodiment.
Figure 62B:
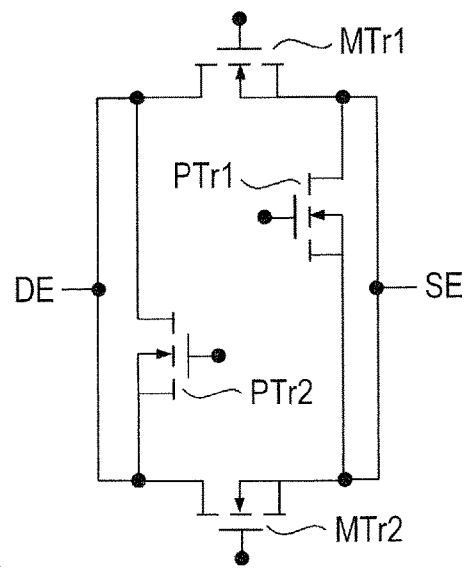
Figure 63:
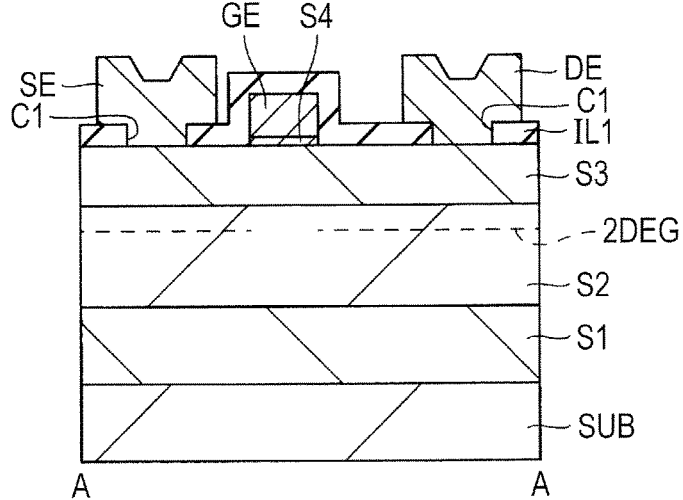
FIG. 63 is a cross section illustrating the structure of a semiconductor device of a fifth embodiment.

In this case, parasitic transistors PTr1 and PTr2 generated along the borders of the active region AC and the element isolation region ISO are arranged so that the sources are coupled and the drains are coupled of the main transistors MTr1 and MTr2 (FIGS. 62A and 62B). Specifically, as illustrated in FIGS. 62A and 62B, in a set of two parasitic transistors PTr coupled in parallel to the main transistors MTr (FIG. 62A), the parasitic transistors PTr1 and PTr2 are coupled to couple the sources of the main transistors MTr1 and MTr2 and couple the drains (FIG. 62B). FIGS. 62A and 62B are circuit diagrams for explaining the circuit structure of the application example.

In the case of the application example, parasitic transistors coupled in parallel to main transistors have infinite channel length, so that the operation of the parasitic transistors can be practically made invalid.

Fifth Embodiment

Although the gate electrode GE is arranged over the mesa-shaped fourth nitride semiconductor layer (cap layer) S4 via the gate insulating film GI in the first embodiment and the like, a junction type FET (also called JFET) having no gate insulating film GI may be also employed.

Figure 64:
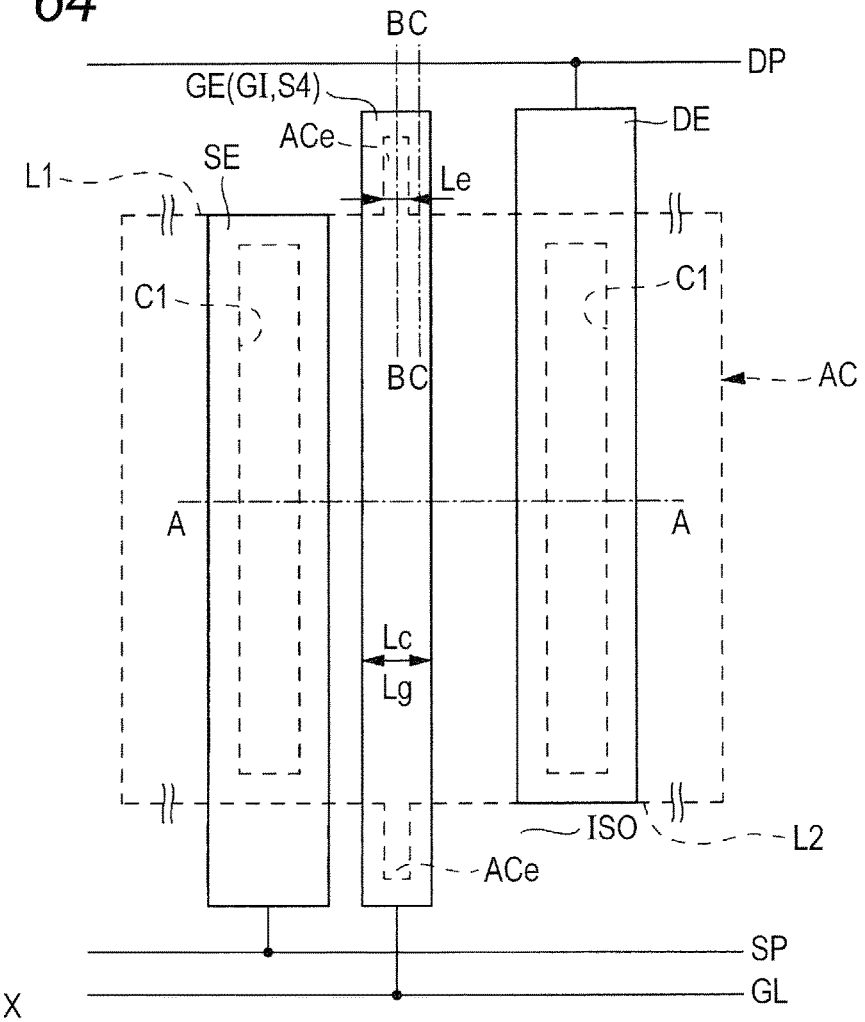
FIG. 64 is a plan view illustrating the structure of the semiconductor device of the fifth embodiment.
Figure 65:
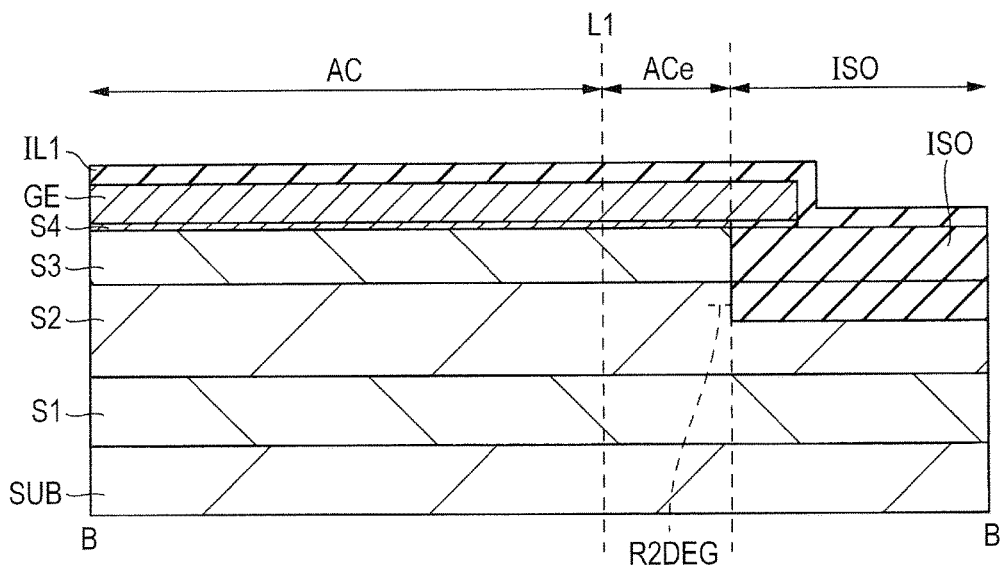
FIG. 65 is a cross section illustrating the structure of the semiconductor device of the fifth embodiment.
Figure 66:
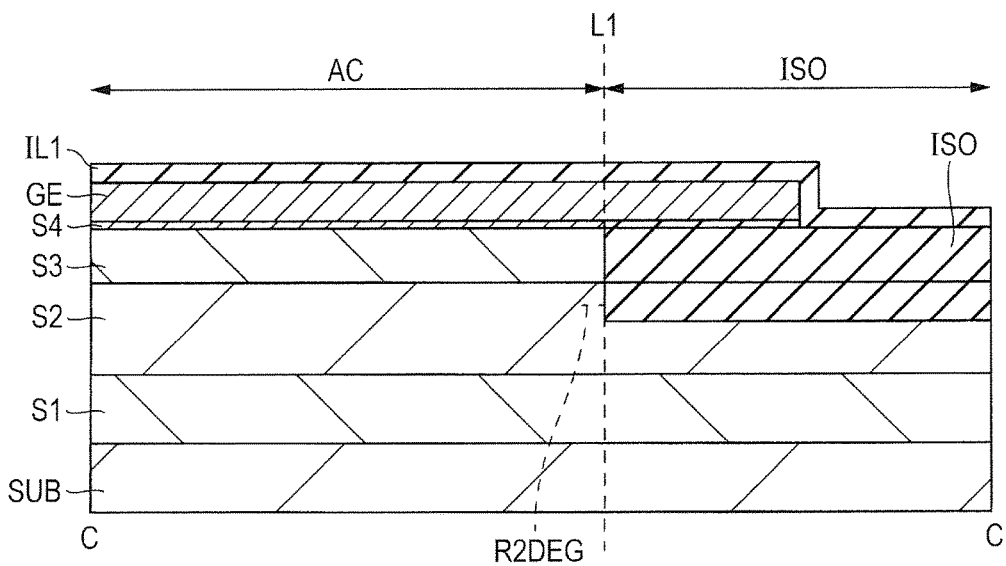
FIG. 66 is a cross section illustrating the structure of the semiconductor device of the fifth embodiment.
Figure 67:
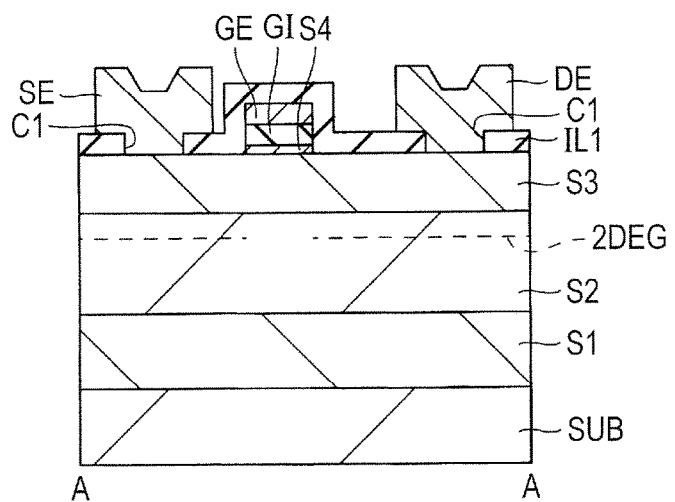
FIG. 67 is a cross section illustrating the structure of a semiconductor device of a sixth embodiment.

FIGS. 63 to 66 are cross sections and plan view illustrating the structure of the semiconductor device of a fifth embodiment. FIG. 64 is a plan view, FIG. 63 corresponds to the A-A section in FIG. 64, FIG. 65 corresponds to the B-B section in FIG. 64, and FIG. 66 corresponds to the C-C section in FIG. 64.

As illustrated in FIGS. 63 to 66, the semiconductor device of the embodiment is similar to the semiconductor device of the first embodiment (FIG. 1) except that the gate insulating film GI is not provided, so that description will not be repeated.

The semiconductor device of the fifth embodiment can be manufactured by, for example, a process obtained by omitting the process of forming the insulating film for the gate insulating film GI in the manufacturing process described in the first embodiment.

Sixth Embodiment

In the first embodiment, the active region AC is provided with the projection part (projection region) ACe. For example, the projection part ACe projected from the line L1 as the end part of the active region AC having an almost rectangular shape (FIG. 2). In contrast, the active region AC may be provided with a recess part (recess region) ACi receded (provided backward) from the line L1.

Figure 68:
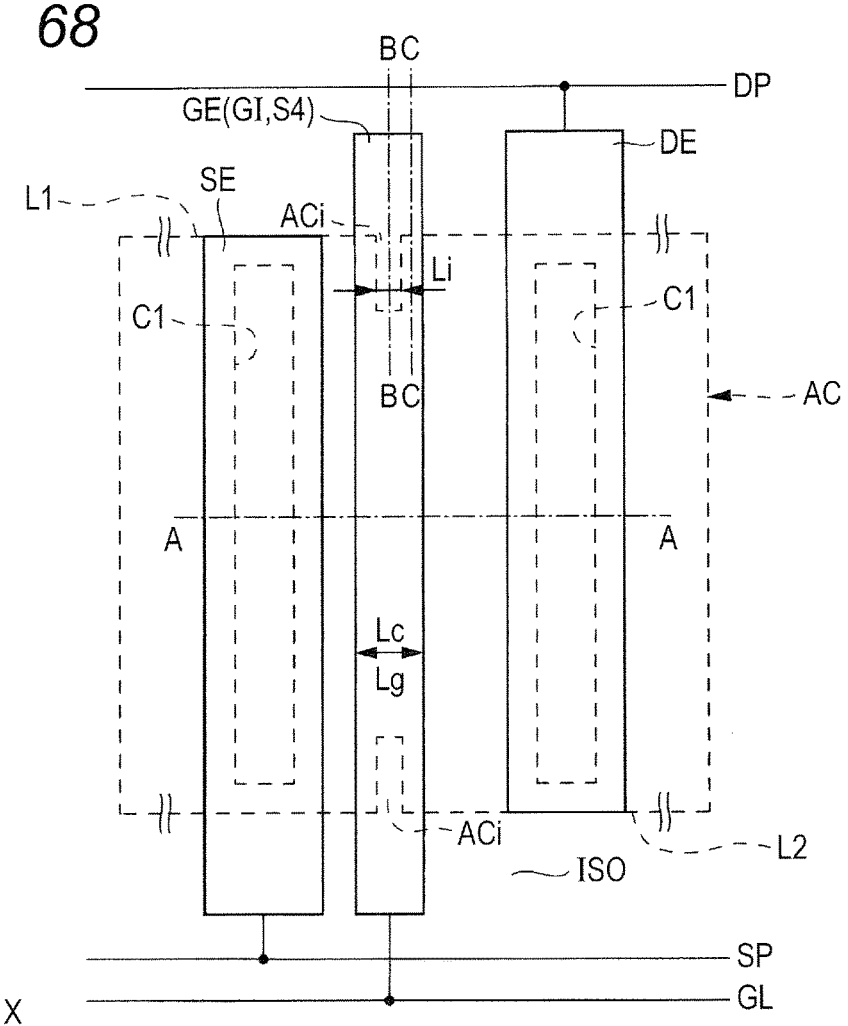
FIG. 68 is a plan view illustrating the structure of the semiconductor device of the sixth embodiment.
Figure 69:
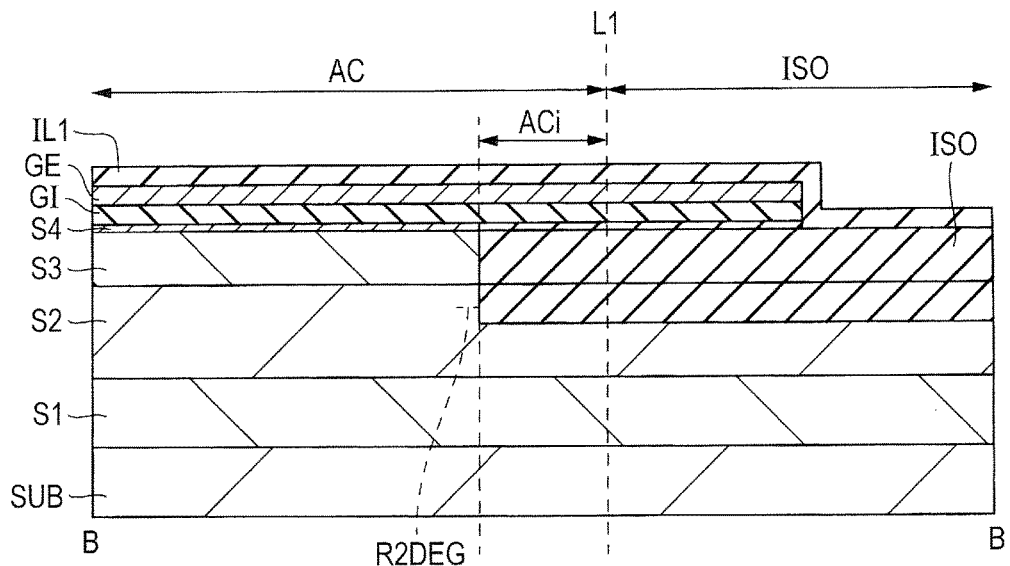
FIG. 69 is a cross section illustrating the structure of the semiconductor device of the sixth embodiment.
Figure 70:
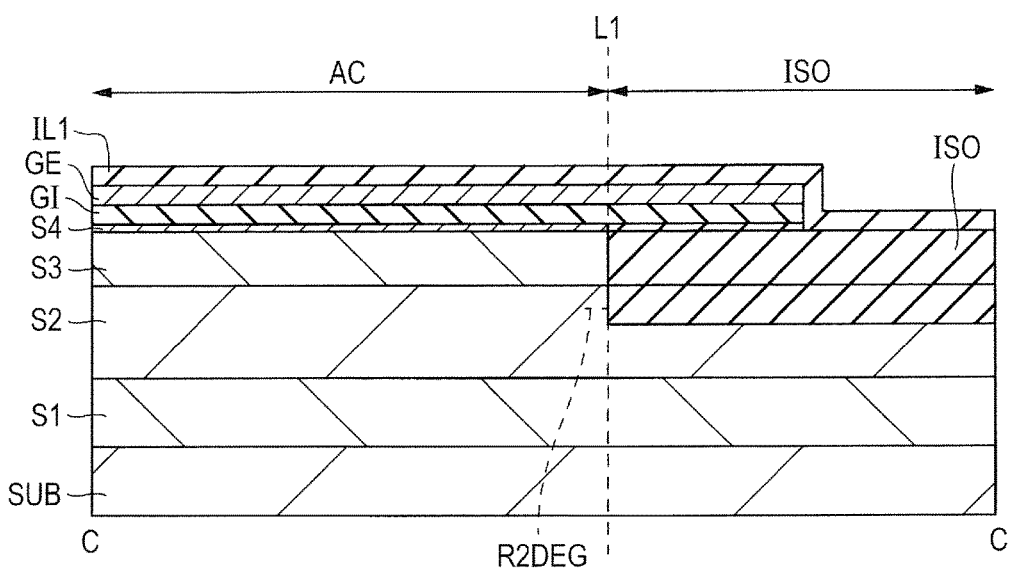
FIG. 70 is a cross section illustrating the structure of the semiconductor device of the sixth embodiment.

FIGS. 67 to 70 are cross sections and plan view illustrating the structure of a semiconductor device of a sixth embodiment. FIG. 68 is a plan view, FIG. 67 corresponds to the A-A section in FIG. 68, FIG. 69 corresponds to the B-B section in FIG. 68, and FIG. 70 corresponds to the C-C section in FIG. 68.

As illustrated in FIGS. 67 to 70, the semiconductor device of the sixth embodiment is similar to the semiconductor device of the first embodiment (FIG. 1) except that the active region AC is provided with the recess part (recess region) ACi, so that description will not be repeated.

The semiconductor device of the embodiment can be formed by, for example, at the time of forming the element isolation region ISO in the manufacturing process described in the first embodiment, forming a photoresist film so that the active region AC has the recess part (recess region) ACi and implanting ion species such as boron (B) or nitrogen (N) using the film as a mask. Since the other process is similar to that of the first embodiment, the description will not be repeated. For example, the length Li in the X direction of the recess ACi (the length in the direction in which current flows from the drain electrode to the source electrode, that is, the gate length direction) is smaller than the length Lg in the X direction of the gate electrode GE. For example, the length Li in the X direction of the recess part ACi is about 1 μm, and the length in the Y direction of the recess part ACi is about 1.8 μm.

As described above, also in the case where the recess part (recess region) ACi is provided in the active region AC, the border line between the active region AC and the element isolation region ISO becomes longer, and the channel length of the parasitic transistor can be increased. As a result, turn-on of the parasitic transistor can be suppressed.

Since the length in the Y direction of the gate electrode GE in FIG. 68 is, for example, about 500 μm to 1000 μm and the length of the recess part ACi is, for example, about 1.8 μm, there is hardly the influence on the operation of the main transistor MTr by the recess part ACi.

Although the present invention achieved by the inventors herein has been concretely described above on the basis of the embodiments, obviously, the present invention is not limited to the foregoing embodiments but can be variously changed without departing from the gist.

For example, to the structure of the second embodiment, the mesa-shaped fourth nitride semiconductor layer (cap layer) of the application example 1 or the source electrode SE of the application example 2 of the third embodiment may be applied. To the JFET in the fifth embodiment, the structure of the element isolation region of the second embodiment, the mesa-shaped fourth nitride semiconductor layer (cap layer) of the application example 1 of the third embodiment, and the source electrode SE of the application example 2 may be applied. The structure of the second embodiment or the JFET of the fifth embodiment may be provided with the recess part (ACi) of the sixth embodiment.

What is claimed is:

1. A semiconductor device comprising:
a first nitride semiconductor layer;
a second nitride semiconductor layer formed on the first nitride semiconductor layer;
a third nitride semiconductor layer formed on the second nitride semiconductor layer;
a mesa-shaped fourth nitride semiconductor layer formed on the third nitride semiconductor layer;
a source electrode formed on the third nitride semiconductor layer and formed on one side of the fourth nitride semiconductor layer;
a drain electrode formed on the third nitride semiconductor layer and formed on the other side of the fourth nitride semiconductor layer;
a gate electrode formed over the fourth nitride semiconductor layer; and
an element isolation region provided in a stack body of the first to fourth nitride semiconductor layers and defining an active region, wherein the gate electrode extends from over the active region to over the element isolation region, and
wherein in plan view, length of a border line between the active region and the element isolation region in a region overlapped with the mesa-shaped fourth nitride semiconductor layer is longer than gate length of the gate electrode.

2. The semiconductor device according to claim 1, wherein a gate insulating film is provided under the gate electrode.

3. The semiconductor device according to claim 1, wherein the border line has a projection part projected from the active region to the direction of the element isolation region in plan view.

4. The semiconductor device according to claim 1, wherein the border line has a recess part recessed from the element isolation region to the inside of the active region in plan view.

5. The semiconductor device according to claim 3, wherein length in a channel length direction of the projection part is smaller than gate length of the gate electrode.

6. The semiconductor device according to claim 4, wherein length in a channel length direction of the recess part is smaller than gate length of the gate electrode.

7. The semiconductor device according to claim 1, wherein the element isolation region is a high-resistive region whose resistance is higher than that of the active region.

8. The semiconductor device according to claim 1, wherein the element isolation region is a region obtained by removing a part of the stack body of the first to fourth nitride semiconductor layers.

9. The semiconductor device according to claim 1, wherein length in the channel length direction of the mesa-shaped fourth nitride semiconductor layer is smaller than the gate length of the gate electrode.

10. The semiconductor device according to claim 3, wherein the length in the channel length direction of the projection part is smaller than that in the channel length direction of the mesa-shaped fourth nitride semiconductor layer.

11. The semiconductor device according to claim 4, wherein the length in the channel length direction of the recess part is smaller than that in the channel length direction of the mesa-shaped fourth nitride semiconductor layer.

12. The semiconductor device according to claim 1, further comprising an interlayer insulating film formed so as to cover the gate electrode,
wherein the source electrode is arranged in a contact hole formed in the interlayer insulating film and extends to a position over the gate electrode.

13. The semiconductor device according to claim 1, wherein the border line has a plurality of apexes.

14. A semiconductor device comprising:
a first nitride semiconductor layer;
a second nitride semiconductor layer formed on the first nitride semiconductor layer;
a third nitride semiconductor layer formed on the second nitride semiconductor layer;
first and second mesa parts made by a fourth nitride semiconductor layer formed on the third nitride semiconductor layer;
a source electrode formed on the third nitride semiconductor layer and between the first and second mesa parts;

a first drain electrode formed on the third nitride semiconductor layer and on the side opposite to the source electrode, of the first mesa part;
a second drain electrode formed on the third nitride semiconductor layer and on the side opposite to the source electrode, of the second mesa part;
a first gate electrode formed over the first mesa part;
a second gate electrode formed over the second mesa part; and
an element isolation region provided in a stack body of the first to fourth nitride semiconductor layers and defining an active region,
wherein the first and second mesa parts extend over the active region and the element isolation region and are coupled,
wherein the first and second gate electrodes extend over the active region and the element isolation region and coupled; and
wherein in plan view, at a border line between the active region and the element isolation region, in a region overlapped with the first and second mesa parts and the fourth nitride semiconductor layer coupling them, the border line on the side of the first drain electrode of the first gate electrode is coupled to a border line on the side of the second drain electrode of the second gate electrode, and
a border line on the side of the source electrode of the first gate electrode is coupled to a border line on the side of the source electrode of the second gate electrode.

15. The semiconductor device according to claim 14,
wherein the border lines of the first and second mesa parts have first and second projection parts projected from the active region toward the element isolation region in plan view, and
wherein length in the channel length direction of the first and second projection parts is smaller than that in the channel length direction of the first and second mesa parts.

16. The semiconductor device according to claim 15,
wherein the active region having a U shape is constructed by the first and second projection parts.

17. A method of manufacturing a semiconductor device, comprising the steps of:
(a) forming a second nitride semiconductor layer on a first nitride semiconductor layer;
(b) forming a third nitride semiconductor layer on the second nitride semiconductor layer;
(c) forming a fourth nitride semiconductor layer on the third nitride semiconductor layer;
(d) forming an element isolation region in a stack body of the first to fourth nitride semiconductor layers and defining an active region; and
(e) forming a gate electrode over the mesa-shaped fourth nitride semiconductor layer,
wherein the gate electrode extends from over the active region to over the element isolation region, and
wherein in plan view, length of a border line between the active region and the element isolation region in a region overlapped with the mesa-shaped fourth nitride semiconductor layer is longer than gate length of the gate electrode.

18. The method of manufacturing a semiconductor device according to claim 17,
wherein the step (d) is a step of forming the element isolation region as a high-resistive region by ion implantation.

19. The method of manufacturing a semiconductor device according to claim 17,
wherein the step (d) is a step of forming the element isolation region by removing a part of the stack body of the first to fourth nitride semiconductor layers.

* * * * *